United States Patent
Blakeney

(10) Patent No.: US 11,821,071 B2
(45) Date of Patent: Nov. 21, 2023

(54) PRECURSORS FOR DEPOSITION OF MOLYBDENUM-CONTAINING FILMS

(71) Applicant: Lam Research Corporation, Fremont, CA (US)

(72) Inventor: Kyle Jordan Blakeney, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/436,944

(22) PCT Filed: Mar. 6, 2020

(86) PCT No.: PCT/US2020/021543
§ 371 (c)(1),
(2) Date: Sep. 7, 2021

(87) PCT Pub. No.: WO2020/185618
PCT Pub. Date: Sep. 17, 2020

(65) Prior Publication Data
US 2022/0170155 A1    Jun. 2, 2022

Related U.S. Application Data

(60) Provisional application No. 62/816,648, filed on Mar. 11, 2019.

(51) Int. Cl.
*C23C 16/18* (2006.01)
*C23C 16/455* (2006.01)

(52) U.S. Cl.
CPC ........ *C23C 16/45553* (2013.01); *C23C 16/18* (2013.01); *C23C 16/45534* (2013.01)

(58) Field of Classification Search
CPC .............. C23C 16/18; C23C 16/45534; C23C 16/45553
See application file for complete search history.

(56) References Cited

U.S. PATENT DOCUMENTS

| 1,012,671 A | 12/1911 | Long |
| 5,502,005 A | 3/1996 | Mikagi |

(Continued)

FOREIGN PATENT DOCUMENTS

| CN | 1957446 A | 5/2007 |
| CN | 104752339 A | 7/2015 |

(Continued)

OTHER PUBLICATIONS

Kurek et al; Recent Advances Using Guanidinate Ligands for Chemical Vapour (CVD) and Atomic Layer Deposition (ALD0 Applications; Aust. J. Chem. 2014, 67; p. 989-996. (Year: 2014).*

(Continued)

*Primary Examiner* — Elizabeth A Burkhart
(74) *Attorney, Agent, or Firm* — Weaver Austin Villenueve & Sampson LLP

(57) ABSTRACT

Molybdenum-containing films are deposited on semiconductor substrates using reactions of molybdenum-containing precursors in ALD and CVD processes. In some embodiments, the precursors can be used for deposition of molybdenum metal films with low levels of incorporation of carbon and nitrogen. In some embodiments, the films are deposited using fluorine-free precursors in a presence of exposed silicon-containing layers without using etch stop layers. The precursor, in some embodiments, is a compound that includes molybdenum, at least one halogen that forms a bond with molybdenum, and at chamber least one organic ligand that includes an element selected from the group consisting of N, O, and S, that forms a bond with molybdenum, In another aspect, the precursor is a molybdenum, compound with at least one sulfur-containing ligand, and preferably no molybdenum-carbon bonds.

16 Claims, 11 Drawing Sheets

(56) References Cited

U.S. PATENT DOCUMENTS

| | | |
|---|---|---|
| 5,643,394 A | 7/1997 | Maydan et al. |
| 6,103,609 A | 8/2000 | Lee et al. |
| 6,306,216 B1 | 10/2001 | Kim et al. |
| 6,359,160 B1 | 3/2002 | Sun et al. |
| 6,635,965 B1 | 10/2003 | Lee et al. |
| 6,794,287 B2 | 9/2004 | Saanila et al. |
| 6,844,258 B1 | 1/2005 | Fair et al. |
| 6,958,174 B1 | 10/2005 | Klaus et al. |
| 7,005,372 B2 | 2/2006 | Levy et al. |
| 7,141,494 B2 | 11/2006 | Lee et al. |
| 7,250,367 B2 | 7/2007 | Vaartstra et al. |
| 7,262,125 B2 | 8/2007 | Wongsenakhum et al. |
| 7,560,581 B2 | 7/2009 | Gordon et al. |
| 7,589,017 B2 | 9/2009 | Chan et al. |
| 7,691,749 B2 | 4/2010 | Levy et al. |
| 7,772,114 B2 | 8/2010 | Chan et al. |
| 7,955,972 B2 | 6/2011 | Chan et al. |
| 8,053,365 B2 | 11/2011 | Humayun et al. |
| 8,058,170 B2 | 11/2011 | Chandrashekar et al. |
| 8,278,216 B1 | 10/2012 | Alers et al. |
| 9,082,826 B2 | 7/2015 | Chandrashekar et al. |
| 9,175,023 B2 | 11/2015 | Odedra et al. |
| 9,236,297 B2 | 1/2016 | Chen et al. |
| 9,583,385 B2 | 2/2017 | Lee et al. |
| 9,595,470 B2 | 3/2017 | Bamnolker et al. |
| 9,613,818 B2 | 4/2017 | Ba et al. |
| 9,653,353 B2 | 5/2017 | Chandrashekar et al. |
| 9,978,605 B2 | 5/2018 | Bamnolker et al. |
| 10,079,144 B2 | 9/2018 | Kim et al. |
| 10,094,021 B2 | 10/2018 | Lansalot-Matras et al. |
| 10,121,671 B2 | 11/2018 | Fu et al. |
| 10,283,404 B2 | 5/2019 | Na et al. |
| 10,510,590 B2 | 12/2019 | Thombare et al. |
| 10,573,522 B2 | 2/2020 | Jandl et al. |
| 10,777,453 B2 | 9/2020 | Thombare et al. |
| 10,995,405 B2 | 5/2021 | Dezelah et al. |
| 11,355,345 B2 | 6/2022 | Jandl et al. |
| 11,549,175 B2 | 1/2023 | Butail et al. |
| 2002/0024140 A1 | 2/2002 | Nakajima et al. |
| 2003/0019428 A1 | 1/2003 | Ku et al. |
| 2003/0082296 A1 | 5/2003 | Elers et al. |
| 2003/0194825 A1 | 10/2003 | Law et al. |
| 2003/0209193 A1 | 11/2003 | Van Wijck |
| 2004/0202786 A1 | 10/2004 | Wongsenakhum et al. |
| 2005/0031786 A1 | 2/2005 | Lee et al. |
| 2005/0186342 A1 | 8/2005 | Sager et al. |
| 2005/0277296 A1 | 12/2005 | Adetutu et al. |
| 2005/0282384 A1 | 12/2005 | Nawafune et al. |
| 2006/0040052 A1 | 2/2006 | Fang et al. |
| 2006/0046521 A1* | 3/2006 | Vaartstra ............ H01L 21/0228 438/778 |
| 2006/0102950 A1 | 5/2006 | Takebuchi et al. |
| 2007/0009658 A1 | 1/2007 | Yoo et al. |
| 2007/0066060 A1 | 3/2007 | Wang |
| 2007/0077712 A1 | 4/2007 | Joo et al. |
| 2008/0014352 A1 | 1/2008 | Xi et al. |
| 2008/0124926 A1 | 5/2008 | Chan et al. |
| 2008/0206987 A1 | 8/2008 | Gelatos et al. |
| 2008/0227291 A1 | 9/2008 | Lai et al. |
| 2008/0254623 A1 | 10/2008 | Chan et al. |
| 2008/0268642 A1 | 10/2008 | Yanagita et al. |
| 2008/0317972 A1 | 12/2008 | Hendriks et al. |
| 2009/0004848 A1 | 1/2009 | Kim et al. |
| 2009/0053893 A1 | 2/2009 | Khandelwal et al. |
| 2009/0081374 A1 | 3/2009 | Yang et al. |
| 2009/0149022 A1 | 6/2009 | Chan et al. |
| 2009/0212280 A1 | 8/2009 | Werner et al. |
| 2009/0239368 A1 | 9/2009 | Park et al. |
| 2010/0107927 A1 | 5/2010 | Stewart et al. |
| 2010/0167527 A1 | 7/2010 | Wu et al. |
| 2010/0213541 A1 | 8/2010 | Jeon et al. |
| 2010/0320607 A1 | 12/2010 | Suzuki |
| 2011/0020546 A1 | 1/2011 | Hamalainen et al. |
| 2011/0021024 A1 | 1/2011 | Calvo-Munoz et al. |
| 2011/0151615 A1 | 6/2011 | Gordon et al. |
| 2011/0256645 A1 | 10/2011 | Tam et al. |
| 2011/0287184 A1 | 11/2011 | Shenai-Khatkhate et al. |
| 2012/0045589 A1 | 2/2012 | Ivanov et al. |
| 2012/0187305 A1 | 7/2012 | Elam et al. |
| 2013/0189837 A1 | 7/2013 | Haukka et al. |
| 2013/0302980 A1 | 11/2013 | Chandrashekar et al. |
| 2014/0106083 A1 | 4/2014 | Wu et al. |
| 2014/0147589 A1 | 5/2014 | Khandelwal et al. |
| 2015/0179461 A1 | 6/2015 | Bamnolker et al. |
| 2015/0262939 A1 | 9/2015 | Sakata |
| 2015/0325475 A1 | 11/2015 | Bamnolker et al. |
| 2015/0348840 A1 | 12/2015 | Bamnolker et al. |
| 2015/0354064 A1 | 12/2015 | Kolics et al. |
| 2016/0027614 A1 | 1/2016 | Manna et al. |
| 2016/0040289 A1 | 2/2016 | Gatineau et al. |
| 2016/0077435 A1 | 3/2016 | Ban et al. |
| 2016/0104624 A1 | 4/2016 | Fu et al. |
| 2016/0109800 A1 | 4/2016 | Bae et al. |
| 2016/0118345 A1 | 4/2016 | Chen et al. |
| 2016/0168699 A1 | 6/2016 | Fukazawa et al. |
| 2016/0172211 A1 | 6/2016 | Demos et al. |
| 2016/0181272 A1 | 6/2016 | Rabkin et al. |
| 2016/0225632 A1 | 8/2016 | Shaikh et al. |
| 2016/0300952 A1 | 10/2016 | Toriumi et al. |
| 2016/0351401 A1 | 12/2016 | Ba et al. |
| 2016/0351444 A1 | 12/2016 | Schloss et al. |
| 2017/0040214 A1 | 2/2017 | Lai et al. |
| 2017/0062224 A1 | 3/2017 | Fu et al. |
| 2017/0069527 A1 | 3/2017 | Haukka et al. |
| 2017/0117155 A1 | 4/2017 | Bamnolker et al. |
| 2017/0125548 A1 | 5/2017 | Hung et al. |
| 2017/0229341 A1 | 8/2017 | Chang et al. |
| 2017/0268107 A1 | 9/2017 | Lansalot-Matras et al. |
| 2017/0306479 A1 | 10/2017 | Raisanen et al. |
| 2017/0306490 A1 | 10/2017 | Chan et al. |
| 2017/0358482 A1 | 12/2017 | Chen et al. |
| 2018/0019165 A1 | 1/2018 | Baum et al. |
| 2018/0053660 A1 | 2/2018 | Jandl et al. |
| 2018/0142345 A1 | 5/2018 | Meng et al. |
| 2018/0166276 A1 | 6/2018 | Nakao et al. |
| 2018/0240675 A1 | 8/2018 | Bamnolker et al. |
| 2018/0261503 A1 | 9/2018 | Meng et al. |
| 2018/0286668 A1 | 10/2018 | Baum et al. |
| 2018/0294187 A1 | 10/2018 | Thombare et al. |
| 2018/0355484 A1 | 12/2018 | Lansalot-Matras et al. |
| 2019/0003050 A1* | 1/2019 | Dezelah ................ C23C 16/16 |
| 2019/0019725 A1 | 1/2019 | Chandrashekar et al. |
| 2019/0067003 A1 | 2/2019 | Zope et al. |
| 2019/0067094 A1 | 2/2019 | Zope et al. |
| 2019/0088555 A1 | 3/2019 | Xie et al. |
| 2019/0161853 A1 | 5/2019 | Aoyama et al. |
| 2019/0189456 A1 | 6/2019 | Mullick et al. |
| 2019/0226086 A1 | 7/2019 | Wright, Jr. et al. |
| 2019/0256467 A1 | 8/2019 | Anthis et al. |
| 2019/0273019 A1 | 9/2019 | Mullick et al. |
| 2020/0006073 A1 | 1/2020 | Smith et al. |
| 2020/0075403 A1 | 3/2020 | Thombare et al. |
| 2020/0105515 A1 | 4/2020 | Maes et al. |
| 2020/0111675 A1 | 4/2020 | Takatsuki et al. |
| 2020/0144066 A1 | 5/2020 | Jandl et al. |
| 2020/0343136 A1 | 10/2020 | Yu et al. |
| 2020/0365456 A1 | 11/2020 | Thombare et al. |
| 2020/0402846 A1 | 12/2020 | Collins et al. |
| 2021/0047726 A1 | 2/2021 | Liu et al. |
| 2021/0140043 A1 | 5/2021 | Thombare et al. |
| 2021/0238736 A1 | 8/2021 | Butail et al. |
| 2021/0285102 A1 | 9/2021 | Yoon et al. |
| 2021/0407809 A1 | 12/2021 | Zope et al. |
| 2022/0013365 A1 | 1/2022 | Van Cleemput et al. |
| 2022/0139713 A1 | 5/2022 | Färm et al. |
| 2022/0195598 A1 | 6/2022 | Collins et al. |
| 2022/0220136 A1 | 7/2022 | Leoncini et al. |
| 2022/0220139 A1 | 7/2022 | Leoncini et al. |
| 2022/0220607 A1 | 7/2022 | Leoncini et al. |
| 2022/0223471 A1 | 7/2022 | Thombare et al. |
| 2022/0262640 A1 | 8/2022 | Jandl et al. |
| 2022/0298624 A1 | 9/2022 | Blakeney et al. |
| 2022/0328317 A1 | 10/2022 | Na et al. |
| 2022/0356579 A1 | 11/2022 | Collins et al. |

(56) References Cited

U.S. PATENT DOCUMENTS

| | | | |
|---|---|---|---|
| 2022/0359211 | A1 | 11/2022 | Van Cleemput et al. |
| 2022/0375792 | A1 | 11/2022 | Schloss et al. |
| 2022/0389579 | A1 | 12/2022 | Thombare et al. |

FOREIGN PATENT DOCUMENTS

| | | | |
|---|---|---|---|
| CN | 105097446 | A | 11/2015 |
| CN | 106575626 | A | 4/2017 |
| CN | 109072424 | A | 12/2018 |
| CN | 109661481 | A | 4/2019 |
| EP | 1728894 | A1 | 12/2006 |
| JP | 2001284360 | A | 10/2001 |
| JP | 2005150416 | A | 6/2005 |
| JP | 2008205219 | A | 9/2008 |
| JP | 2008211183 | A | 9/2008 |
| JP | 2012246531 | A | 12/2012 |
| JP | 2014074190 | A | 4/2014 |
| JP | 2016098406 | A | 5/2016 |
| JP | 2016516892 | A | 6/2016 |
| JP | 2017053024 | A | 3/2017 |
| KR | 20030043201 | A | 6/2003 |
| KR | 20050054122 | A | 6/2005 |
| KR | 20100096488 | A | 9/2010 |
| KR | 20150063562 | A | 6/2015 |
| KR | 20150108780 | A | 9/2015 |
| KR | 20160098986 | A | 8/2016 |
| KR | 101745074 | B1 | 6/2017 |
| TW | 201123305 | A | 7/2011 |
| TW | 201705490 | A | 2/2017 |
| TW | 201710543 | A | 3/2017 |
| TW | 201738405 | A | 11/2017 |
| TW | 201812069 | A | 4/2018 |
| TW | 201812070 | A | 4/2018 |
| WO | WO-2006036865 | A2 | 4/2006 |
| WO | WO-2012047591 | A1 | 4/2012 |
| WO | WO-2015023404 | A1 | 2/2015 |
| WO | WO-2016191432 | A1 | 12/2016 |
| WO | WO-2018191183 | A1 | 10/2018 |
| WO | WO-2019099233 | A1 | 5/2019 |
| WO | WO-2020023790 | A1 | 1/2020 |
| WO | WO-2020028587 | A1 | 2/2020 |
| WO | WO-2020185618 | A1 | 9/2020 |
| WO | WO-2021035236 | A1 | 2/2021 |
| WO | WO-2021076636 | A1 | 4/2021 |

OTHER PUBLICATIONS

Otsuka et al.; A Novel Molybdenum Thiolato Compound, Tetrakis(tert-butylthiolato)molybdenum(IV).Preparation and Crystal and Molecular Structure; J. Am. Chem. Soc., vol. 103, No. 11, p. 3011-3013. (Year: 1981).*

Anonymous, "Lam Research enables next-generation memory with industry's first ALD process for low-fluorine tungsten fill" Semiconductor Digest News and Industry Trends for Solid State Technology, Aug. 2016, 2 Pages.

Chinese First Office Action dated Jan. 4, 2021 issued in Application No. CN 201710700258.6.

Chinese Second Office Action dated Jun. 17, 2021 issued in Application No. CN 201710700258.6.

Chiu, H. et al., "Deposition of Molybdenum Carbonitride Thin Films from Mo(NBu$^t$)$_2$(NHBu$^t$)$_2$", J. Mater. Res, Jul. 1994, vol. 9, No. 7, pp. 1622-1624.

Co-pending U.S. Appl. No. 17/763,529, filed Mar. 24, 2022.

Coventor Brochure "3D NAND: Challenges Beyond 96-Layer Memory Arrays", Oct. 12, 2018, pp. 1-4.

Dominique, S. et al., "An alternative to Tungsten in 3D-NAND technology", IEEE International Interconnect Technology Conference (IITC), 2021, pp. 1-3.

Final Office Action dated May 23, 2019 issued in U.S. Appl. No. 15/948,143.

Final Office Action dated Sep. 2, 2021 issued in U.S. Appl. No. 16/947,286.

International Preliminary Report on Patentability dated Mar. 10, 2022, in Application No. PCT/US2020/070434.

International Preliminary Report on Patentability dated Mar. 3, 2022, in Application No. PCT/US2020/070390.

International Search Report and Written Opinion dated Feb. 3, 2021, in Application No. PCT/US2020/055596.

International Search Report and Written Opinion dated Jun. 9, 2022 in International Application No. PCT/US2022/017005.

International Search Report and Written Opinion dated Sep. 7, 2022 in Application No. PCT/US2022/028845.

International Preliminary Report on Patentability dated Apr. 28, 2022, in PCT Application No. PCT/US2020/055596.

International Preliminary Report on Patentability dated Aug. 12, 2021, issued in Application No. PCT/US2020/015241.

International Preliminary Report on Patentability dated Feb. 4, 2021 in Application No. PCT/US2019/043514.

International Preliminary Report on Patentability dated Jun. 3, 2021 in Application No. PCT/US2019/062067.

International Preliminary Report on Patentability dated Jun. 4, 2020 in Application No. PCT/US2018/061803.

International Preliminary Report on Patentability dated Mar. 17, 2022 in PCT Application No. PCT/US2020/048951.

International Preliminary Report on Patentability dated Nov. 12, 2020 in Application No. PCT/US2019/030712.

International Preliminary Report on Patentability dated Oct. 24, 2019 in Application No. PCT/US2018/026746.

International Preliminary Report on Patentability dated Sep. 23, 2021 issued in Application No. PCT/US2020/021543.

International Search Report and Written Opinion dated Aug. 19, 2019 in Application No. PCT/US2019/030712.

International Search Report and Written Opinion dated Dec. 4, 2020, in PCT Application No. PCT/US2020/048951.

International Search Report and Written Opinion dated Feb. 4, 2021, in PCT Application No. PCT/US2020/070390.

International Search Report and Written Opinion dated Jul. 1, 2020 in Application No. PCT/US2020/021543.

International Search Report and Written Opinion dated Jul. 27, 2018 in Application No. PCT/US2018/026746.

International Search Report and Written Opinion dated Jun. 3, 2020, issued in Application No. PCT/US2020/015241.

International Search Report and Written Opinion dated Mar. 8, 2019 in Application No. PCT/US2018/061803.

International Search Report and Written Opinion dated Mar. 9, 2020 in Application No. PCT/US2019/062067.

International Search Report and Written Opinion dated Nov. 11, 2019 in Application No. PCT/US2019/043514.

International Search Report and Written Opinion dated Nov. 11, 2020 issued in Application No. PCT/US2020/070434.

Jamie, W. et al., "In Situ Atomic Layer Deposition and Electron Tunneling Characterization of Monolayer Al$_2$O$_3$ on Fe for Magnetic Tunnel Junctions", AIP Advances, 2018, vol. 8, No. 125218, pp. 1-9.

Johnson, R.W., Hultqvist, A., Bent, S.F., "A brief review of atomic layer deposition: from fundamentals to applications", Materials today, (Jun. 1, 2014), 17(5):236-46.

JP Office Action dated Apr. 19, 2022 in Application No. JP20200504286 with English translation.

Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.

KR Office Action dated Sep. 27, 2022, in Application No. KR10-2017-0102113.

KR Office Action dated Feb. 21, 2022, in Application No. KR10-2017-0102113 with English Translation.

KR Office Action dated May 30, 2022, in Application No. KR10-2019-7033130 With English Translation.

Lee, B. et al., "ALD Tungsten Solves Capacity Challenges in 3D NAND Device Manufacturing", Lam Brochure, Jan. 2019, pp. 1-4.

Li, Z. et al., "Atomic Layer Deposition of Ultrathin Copper Metal Films from a Liquid Copper(I) Amidinate Precursor", Journal of the Electrochemical Society, 2006, vol. 153, No. 11, pp. C787-C794.

(56) References Cited

OTHER PUBLICATIONS

Lim, B. et al., "Atomic Layer Deposition of Transition Metals", Nature Materials, 2003, vol. 2, pp. 749-754.
Lin, S. et al., "Effect of Nitrogen on the Physical Properties and work Function of $MoN_x$ Cap Layers on $HfO_2$ Gate Dielectrics", ECS Journal of Solid State Science and Technology, 2014, vol. 3, No. 12, pp. N161-N165.
Majumder et al. "Investigation on the diffusion barrier properties of sputtered Mo/W-N thin films in Cu interconnects," Applied Physics Letters, vol. 91 (2007), pp. 162108-1-162108-3.
McCain, M.N. et al., "Aerosol-Assisted Chemical Vapor Deposition of Lubricating $MoS_2$ Films. Ferrous Substrates and Titanium Film Doping", Chemistry of Materials, 2008, vol. 20, No. 16, pp. 5438-5443.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A , 2019, vol. 37, No. 2, 021503, 6 pages.
Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.
Notice of Allowance dated Apr. 27, 2020 issued in U.S. Appl. No. 16/676,169.
Notice of Allowance dated Aug. 6, 2019 issued in U.S. Appl. No. 15/948,143.
Office Action dated Apr. 27, 2021 issued in U.S. Appl. No. 16/947,286.
Office Action dated Aug. 12, 2021 issued in U.S. Appl. No. 16/764,812.
Office Action dated Feb. 4, 2019 issued in U.S. Appl. No. 15/948,143.
Office Action Requirement for Restriction/Election dated Sep. 22, 2021 issued in U.S. Appl. No. 17/250,452.
Ranade, P. et al., "Work Function Engineering of Molybdenum Gate Electrodes by Nitrogen Implantation", Electrochemical and Solid-State Letters, 2001, vol. 4, No. 11, pp. G85-G87.
Shimizu, H. et al., "Precursor-based designs of nano-structures and their processing for Co(W) alloy films as a single layered barrier/liner layer in future Cu-interconnect", Journal of Materials Chemistry C, 2015, vol. 3, pp. 2500-2510.
Specification of U.S. Appl. No. 62/425,704 (Electronically filed Nov. 23, 2016).
TW Office Action dated Aug. 16, 2022, in Application No. TW107141042 with English translation.
TW Office Action dated May 24, 2022, in Application No. TW20180112210 with English translation.
TW Office Action dated Oct. 18, 2021, in application No. TW107112210 with English translation.
TW Office Action dated Sep. 14, 2022, in Application No. TW107112210 with English translation.
U.S Advisory Action dated May 3, 2022 in U.S. Appl. No. 16/764,812.
U.S. Advisory Action dated Oct. 18, 2022, in U.S. Appl. No. 17/250,452.
U.S. Corrected Notice of Allowance dated Feb. 16, 2022, in U.S. Appl. No. 16/724,231.
U.S. Corrected Notice of Allowance dated May 11, 2022, in U.S. Appl. No. 16/724,231.
U.S. Final office Action dated Jul. 25, 2022 in U.S. Appl. No. 17/250,452.
U.S. Final Office Action dated Jan. 31, 2022 in U.S. Appl. No. 16/764,812.
U.S. Final Office Action dated Mar. 29, 2021 issued in U.S. Appl. No. 16/724,231.
U.S. Non Final Office Action dated Mar. 21, 2022, in U.S. Appl. No. 17/250,452.
U.S. Non-Final Office Action dated Dec. 15, 2021 in U.S. Appl. No. 17/250,014.
U.S. Non-Final Office Action dated May 16, 2022 in U.S. Appl. No. 16/764,812.
U.S. Non-Final Office Action dated Nov. 19, 2021, in U.S. Appl. No. 17/250,452.
U.S. Notice of Allowance dated Feb. 2, 2022 in U.S. Appl. No. 16/724,231.
U.S. Notice of Allowance dated Jun. 7, 2022 in U.S. Appl. No. 17/250,014.
U.S. Notice of Allowance dated Sep. 16, 2022 in U.S. Appl. No. 17/250,014.
U.S. Notice of allowance dated Sep. 29, 2021 issued in U.S. Appl. No. 16/724,231.
U.S. Office Action dated Sep. 22, 2020 issued in U.S. Appl. No. 16/724,231.
U.S. Office Action Restriction/Election dated Sep. 9, 2021 issued in U.S. Appl. No. 17/250,014.
U.S. Appl. No. 17/814,206, inventors Collins et al., filed Jul. 21, 2022.
U.S. Appl. No. 17/814,207, inventors Thombare et al., filed Jul. 21, 2022.
U.S. Appl. No. 17/814,209, inventors Cleemput et al., filed Jul. 21, 2022.
CN Office Action dated Feb. 28, 2023 in Application No. 201880038116.0 with English translation.
CN Office Action dated Jan. 13, 2023 in CN Application No. CN201980049916.7 with English Translation.
CN Office Action dated Jan. 16, 2023 in Application No. CN202080020646.X with English translation.
CN Office Action dated Nov. 17, 2022, in Application No. CN202080011300.3 with English translation.
International Preliminary Report on Patentability dated Dec. 1, 2022, in PCT Application No. PCT/US2021/033564.
International Search Report and Written Opinion dated Sep. 9, 2021 in Application No. PCT/US2021/033564.
International Search Report and Written Opinion dated Apr. 7, 2023 in PCT Application No. PCT/US2022/080705.
International Search Report and Written Opinion dated Apr. 27, 2023 in PCT Application No. PCT/US2022/080863.
JP Office Action dated Jun. 6, 2023 in Application No. JP2020561743 With English translation.
Juppo, et al., "Deposition of Molybdenum Thin Films by an Alternate Supply of MoCl 5 and Zn," Journal of Vacuum Science and Technology A, vol. 16, Sep./Oct. 1998, doi: 10.1116/1.581430, pp. 2845-2850.
KR Office Action dated Jan. 27, 2023 in Application No. KR10-2017-0102113 with English Translation.
KR Office Action dated Oct. 27, 2022 in Application No. KR10-2022-7026373 with English translation.
KR Office Action dated Sep. 27, 2022, in Application No. KR10-2017-0102113 with English translation.
Muhtade, M., et al., "Time Influence on Thickness and Grains for Molybdenum Thin Film," 2017, e-ISSN: 2289-8131, vol. 9, No. 2-13.
Seghete, D. et al., Molybdenum Atomic Layer Deposition Using MoF6 and Si2H6 as the Reactants, Chemistry of Materials, 2011, vol. 23 No. 7, pp. 1668-1678.
SG Search Report and Written Opinion dated Feb. 10, 2023 in Application No. SG11202109796Q.
Singapore Written Opinion dated Mar. 15, 2023 issued in Application No. SG11202108217U.
TW Office Action dated Feb. 10, 2023 in Application No. TW107112210 with English translation.
TW Office Action dated Feb. 23, 2023 in Application No. TW108126326 with English translation.
U.S. Final Office Action dated Mar. 1, 2023 in U.S. Appl. No. 17/250,452.
U.S. Final Office Action dated May 31, 2023, in U.S. Appl. No. 17/814,207.

(56) References Cited

OTHER PUBLICATIONS

U.S. Final Office Action dated Nov. 30, 2022 in U.S. Appl. No. 16/764,812.
U.S. Non-Final Office Action dated Feb. 2, 2023 in U.S. Appl. No. 17/589,416.
U.S. Non-Final Office Action dated Feb. 2, 2023 in U.S. Appl. No. 17/662,220.
U.S. Non-Final Office Action dated Nov. 30, 2022 in U.S. Appl. No. 17/814,207.
U.S. Appl. No. 17/999,255, inventors Tarafdar et al., filed Nov. 18, 2023.
U.S. Appl. No. 62/362,582, inventors Meng et al., filed Jul. 14, 2016.
U.S. Supplemental Notice of Allowance dated Dec. 14, 2022 in U.S. Appl. No. 17/250,014.
Barry, S.T., "Amidinates, Guanidinates and Iminopyrrolidinates: Understanding Precursor Thermolysis to Design a Better Ligand," Coordination Chemistry Reviews, Dec. 2013, vol. 257(23-24), pp. 3192-3201.
Barry, S.T., et al., "The Chemistry of Inorganic Precursors during the Chemical Deposition of Films on Solid Surfaces," Accounts of chemical research, 2018, vol. 51, pp. 800-809.
Colaianni, M.L., et al., "The Adsorption and Dissociation of Carbon Monoxide on Clean and Oxygen-Modified Mo(110) Surfaces," Journal of the American Chemical Society, 1992, vol. 114(10), pp. 3735-3743.
Cotton, F.A., "Strong Homonuclear Metal-Metal Bonds," Accounts of Chemical Research, 1969, vol. 2 (8), pp. 240-247.
Dezelah IV, C.L., et al., "A Low Valent Metalorganic Precursor for the Growth of Tungsten Nitride Thin Films by Atomic Layer Deposition," Journal of Materials Chemistry, 2007, vol. 17, pp. 1109-1116.
Dezelah IV, C.L., et al., "Atomic Layer Deposition of Tungsten(III) Oxide Thin Films from W2(NMe2)6 and Water: Precursor-Based Control of Oxidation State in the Thin Film Material," Journal of the American Chemical Society, Aug. 2, 2006, vol. 128(30), pp. 9638-9639.
International Search Report and Written Opinion dated Jun. 19, 2023, in Application No. PCT/US2023/062877.
Ishihara, S., et al., "MOCVD of Monolayer MoS2 using Novel Molybdenum Precursor i-Pr2DADMo(CO)3," Materials Research Society, 2018, vol. 3, pp. 379-384.
Karunarathne, M.C., et al., "Synthesis, Structural Characterization, and Volatility Evaluation of Zirconium and Hafnium Amidate Complexes," Journal of Organometallic Chemistry, 2017, vol. 847, pp. 204-212.
Kerrigan, M.M., et al., "Low Temperature, Selective Atomic Layer Deposition of Cobalt Metal Films Using Bis(1,4-di-tert-butyl-1,3-diazadienyl)cobalt and Alkylamine Precursors," Chemistry of Materials, 2017, vol. 29(17), pp. 7458-7466.
Kerrigan, M.M., et al., "Low Temperature, Selective Atomic Layer Deposition of Nickel Metal Thin Films," ACS Applied Materials & Interfaces, 2018, vol. 10(16), pp. 14200-14208.
Kim, T., et al., "Thermal Chemistry of Cu(I)-Iminopyrrolidinate and Cu(I)-Guanidinate Atomic Layer Deposition (ALD) Precursors on Ni(110) Single-Crystal Surfaces," Chemistry of Materials, 2013, vol. 25, pp. 3630-3639.
Knisley, T.J., et al., "Volatility and High Thermal Stability in Mid to Late First Row Transition Metal Diazadienyl Complexes," Organometallics, 2011, vol. 30(18), pp. 5010-5017.
Makela, M., et al., "Thermal Atomic Layer Deposition of Continuous and Highly Conducting Gold Thin Films," Chemistry of Materials, 2017, vol. 29, pp. 6130-6136.
Ouyang, T., et al., "A Surface Chemistry Route to Molybdenum Sulfide and Germanide Films Using the Single-Source Precursor Tetrakis(diethylaminodithiocarbomato)molybdate(IV)," The Journal of Physical Chemistry B, 2004, vol. 108(5), pp. 17537-17545.
U.S. Final office Action dated Jun. 26, 2023 in U.S. Appl. No. 17/589,416.
U.S. Non-Final Office Action dated Jun. 20, 2023, in U.S. Appl. No. 17/250,452.
Zhao, Y., et al., "Synthesis and Structures of Mono- and Dinuclear Molybdenum Complexes with Reduced α-Diimine Ligands," European Journal of Inorganic Chemistry, 2016, pp. 5411-5417.
International Search Report and Written Opinion dated Aug. 11, 2023, in Application No. PCT/US2023/019795.
International Search Report and Written Opinion dated Aug. 16, 2023, in Application No. PCT/US2023/017635.
International Search Report and Written Opinion dated Aug. 16, 2023, in Application No. PCT/US2023/019000.
International Search Report and Written Opinion dated Aug. 16, 2023, in Application No. PCT/US2023/019800.
KR Office Action dated Jul. 28, 2023, in Application No. KR10-2023-0081299 with English Translation.
U.S. Non-Final Office Action dated Aug. 29, 2023, in U.S. Appl. No. 17/310,293.
U.S. Non-Final Office Action dated Jul. 20, 2023, in U.S. Appl. No. 17/814,209.

\* cited by examiner

| | | | |
|---|---|---|---|
| Thioether | SR₂ | Thiolate | ⁻SR |
| | 18 | | 19 |

| | | | |
|---|---|---|---|
| Dithiolene |  20 | Alpha-iminothiolene |  23 |
| |  21 | Alpha-Dithiolate |  24 |
| |  22 | Beta-Dithiolate |  25 |

(Equation 1)

(Equation 2)

PRECURSORS FOR DEPOSITION OF MOLYBDENUM-CONTAINING FILMS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

FIELD OF THE INVENTION

This invention pertains to methods of semiconductor device manufacturing. Specifically, embodiments of this invention pertain to precursors used for deposition of molybdenum-containing films in semiconductor processing.

BACKGROUND

In integrated circuit (IC) fabrication, deposition and etching techniques are used for forming patterns of materials, such as for forming metal lines embedded in dielectric layers. Some patterning schemes require conformal deposition of materials. where the deposited layer should follow the contour of protrusions and/or recessed features on the surface of the substrate. Atomic layer deposition (ALD) is often a preferred method of forming conformal films on a substrate, because ALD relies on adsorption of one or more reactants (precursors) to the surface of the substrate, and on subsequent chemical transformation of the adsorbed layer to the desired material. Because ALD uses sequential reactions that occur on the surface of the substrate. that are separated in time, and that are typically limited by the amount of the adsorbed reactant, this method can provide thin conformal layers having excellent step coverage.

Chemical vapor deposition (CVD) is another deposition method widely used in semiconductor processing. In CVD, the reaction occurs in the volume of the process chamber, and is not limited by the amount of reactants adsorbed to the substrate. As a result, CVD-deposited films are often less conformal than ALD-deposited films. CVD is typically used in applications where step coverage is less important.

ALD and CVD may employ plasma to promote the reactions of the deposition precursors resulting in the formation of the desired films. The methods that make use of the plasma are known as plasma enhanced ALD (PEALD) and plasma enhanced CVD (PECVD). The methods that do not employ plasma are referred to as thermal ALD and thermal CVD.

While ALD and CVD are most commonly used for deposition of silicon-containing films, such as silicon oxide, silicon nitride, and silicon carbide, these methods are also suitable for deposition of some metals, most notably tungsten and cobalt.

The background description provided herein is for the purposes of generally presenting the context of the disclosure. Work of the presently named inventor, to the extent it is described in this background section, as well as aspects of the description that may not otherwise qualify as prior art at the time of filing, are neither expressly nor impliedly admitted as prior art against the present disclosure.

SUMMARY

Methods for depositing molybdenum-containing films, such as metallic molybdenum, molybdenum nitride ($MoN_x$), molybdenum carbide ($MoC_x$), molybdenum boride ($MoB_x$), molybdenum silicide ($MoSi_x$), and combinations thereof such as molybdenum carbonitride ($MoC_xN_y$), molybdenum boride carbide ($MoB_xC_y$), are provided. Precursors for deposition of molybdenum-containing films are also provided.

In one aspect, a precursor for deposition of molybdenum-containing films includes molybdenum. at least one halogen that forms a bond with molybdenum, and at least one organic ligand that includes an element selected from the group consisting of N, O, and S, that forms a bond with molybdenum, with a proviso that the compound is not a molybdenum complex concurrently containing both an imide and a guanidinate organic ligands. In some embodiments the precursor compound is $Mo(X)_m(L)_n$, wherein each X is a halogen independently selected from the group consisting of F, Cl, Br, and I; each L is an organic ligand that includes an element selected from the group consisting of N, O, and S, and wherein m is selected from 1-4, and n is selected from 1-3. In some embodiments the organic ligand or ligands are independently selected from amidinates, amines, amidates, iminopyrrolidinates. diazadienes, beta-imino amides, alpha-imino alkoxides, beta-amino alkoxides, beta-diketiminates. beta-ketoiminates, beta-diketonates, thioethers, thiolates, dithiolates, dithiolenes, and pyrazolates, where each may be substituted or unsubstituted.

In another aspect a precursor for deposition of molybdenum-containing films includes: molybdenum. at least one substituted or unsubstituted 1,4-diazabuta-1,3-diene (DAD) ligand bound to molybdenum, and at least one second ligand. The DAD ligand in some embodiments is selected from the group consisting of:
neutral DAD,

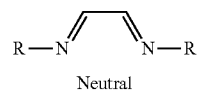

Neutral monoanionic DAD,

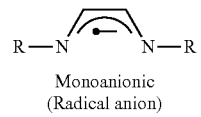

Monoanionic
(Radical anion)

and dianionic DAD,

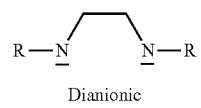

Dianionic wherein each R is independently selected from the group consisting of H, alkyl, fluoroalkyl, alkylsilyl, alkylamino, and alkoxy substituents. The second ligand is selected from the group consisting of an anionic ligand and a neutral ligand, with a proviso that the compound does not include CO as the only second ligand. In some embodiments the precursor compound is $Mo(DAD)_m(L)_n(X)_p$, wherein each L is the neutral ligand, each X is an anionic ligand, m is selected from 1-3, n is selected from 0-4, and p is selected from 0-4, wherein n and p are not simultaneously zero. In some embodiments each neutral ligand L is independently selected from the group consisting of CO, an amine, a phosphine, a nitrile, an isonitrile, and a thioether, and each anionic ligand X is independently selected from the group consisting of a halide, an alkyl, an allyl, a cyclopentadienyl, an alkoxide, an amide, and an imide.

In another aspect. a precursor for deposition of molybdenum-containing films is provided, wherein the precursor is $Mo_2L_n$, wherein each L is independently an amidinate or a guanidinate ligand, n is selected from 2-5, and wherein the precursor comprises a multiple molybdenum-molybdenum bond. In some embodiments the amidinate ligand is:

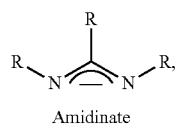

Amidinate wherein each R is independently selected from the group consisting of of H, alkyl, fluoroalkyl, alkylsilyl, alkylamino, and alkoxy substituents. In some embodiments, the guanidinidate ligand is:

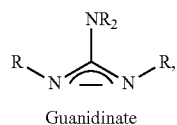

Guanidinate wherein each R is independently selected from the group consisting of H, alkyl, fluoroalkyl, alkylsilyl, alkylamino, and alkoxy substituents.

In another aspect, a precursor for deposition of molybdenum-containing films is a compound that includes molybdenum and at least one alpha-iminothiolene ligand 23 bound to molybdenum, wherein each R in the alpha-iminothiolene ligand 23 is independently selected from the group consisting of of H, alkyl, fluoroalkyl, alkylsilyl, alkylamino, and alkoxy substituents.

In some embodiments molybdenum-containing precursors provided herein have a vaporization temperature of 200° C. or less.

In another aspect, a method of forming a molybdenum-containing layer (e.g., molybdenum metal, molybdenum nitride, molybdenum carbide, molybdenum boride or molybdenum silicide) on a semiconductor substrate is provided, wherein the method includes introducing any of the molybdenum-containing precursors disclosed herein into a process chamber housing the semiconductor substrate; and reacting the molybdenum-containing precursor to form a molybdenum-containing layer on the semiconductor substrate. In some embodiments, the precursors used in deposition are as described above. In one embodiment, the molybdenum-containing precursor is $Mo_2L_n$, wherein each L is independently selected from the group consisting of an amidate, an amidinate and a guanidinate ligands, wherein n is selected from 2-5, and wherein the molybdenum-containing precursor comprises a multiple molybdenum-molybdenum bond.

In some embodiments, a method for selectively depositing a molybdenum-containing layer on a dielectric layer in a presence of an exposed metal layer on a semiconductor substrate, is provided. The method includes: (a) providing a semiconductor substrate having an exposed metal layer and an exposed dielectric layer, wherein the dielectric layer comprises exposed Si—O—H bonds; (b) contacting the semiconductor substrate with a molybdenum-containing precursor, the precursor comprising a ligand having a deprotonated nitrogen that forms a bond to molybdenum; and (c) reacting the molybdenum-containing precursor to selectively form the molybdenum-containing layer on the layer of dielectric.

In some embodiments, a method for selectively depositing a molybdenum-containing layer on a metal layer in a presence of an exposed dielectric layer on a semiconductor substrate, is provided. The method includes: (a) providing a semiconductor substrate having an exposed metal layer and an exposed dielectric layer; (b) contacting the semiconductor substrate with a molybdenum-containing precursor, the precursor comprising molybdenum and at least one of radical anion ligands dithiolene 21 and alpha-iminothiolene 23, bound to molybdenum, wherein each R is independently selected from H, alkyl, fluoroalkyl, alkylamino, alkylsilyl, and alkoxy; and (c) reacting the molybdenum-containing precursor to selectively form the molybdenum-containing layer on the layer of metal.

In some embodiments a method of forming a molybdenum metal layer (e.g., a high purity molybdenum metal layer) on a semiconductor substrate is provided. In some embodiments, the method includes: (a) introducing a molybdenum-containing precursor into a process chamber housing the semiconductor substrate, and (b) reacting the molybdenum-containing precursor to form molybdenum metal on the semiconductor substrate. The molybdenum-containing precursor may be any precursor described herein. In one aspect, the precursor is a compound that includes molybdenum, at least one halogen that forms a bond with molybdenum, and at least one organic ligand that includes an element selected from the group consisting of N, O, and S, that forms a bond with molybdenum. In another aspect, the precursor is a compound that includes molybdenum; and at least one sulfur-containing ligand that forms molybdenum-sulfur bond with molybdenum, wherein the compound does not include molybdenum-carbon bonds. In another aspect the molybdenum precursor is a compound that includes a molybdenum-molybdenum multiple bond. The precursor can be reacted with at least one reactant selected from the group consisting of hydrogen ($H_2$), ammonia ($NH_3$), hydrazine, an amine, borane ($B_2H_6$), silane ($SiH_4$), disilane ($Si_2H_6$), water, alcohol, $H_2S$, and a thiol, optionally using plasma activation. In some embodiments the precursor is reacted first with one of the reactants from this group, followed by a reaction with a different reactant from this group. For example, the precursor may be reacted with water, a thiol, or $H_2S$, followed by treatment with $H_2$, where $H_2$ treatment can be performed with or without a plasma. The reactions in some embodiments occur only on the surface of the substrate. In other embodiments the reactions may occur in the volume of the process chamber.

The methods can be used to deposit molybdenum metal with low carbon content, such as molybdenum metal with carbon content of less than about 5% atomic.

In another aspect, a system for processing a semiconductor substrate. is provided, where the system includes: (a) a processing chamber, having a substrate holder and one or more inlets for introduction of reactants to the processing chamber; and (b) a system controller comprising program instructions for performing any of the methods provided herein. In some embodiments, the system controller includes program instructions for: (i) causing an introduction of any of the molybdenum-containing precursors described herein to the processing chamber; and (ii) causing the molybdenum-containing precursor to react and form a molybdenum-containing layer on the semiconductor substrate. In some embodiments the system controller includes program instructions for (i) causing an introduction of a molybdenum-containing precursor to the processing chamber, wherein the molybdenum-containing precursor is $Mo_2L_n$, wherein each L is independently selected from the group consisting of an amidate, an amidinate and a guanidinate ligands, wherein n is 2-5, and wherein the molybdenum-containing precursor comprises a multiple molybdenum-molybdenum bond; and (ii) causing the molybdenum-containing precursor to react and form a molybdenum containing layer on the semiconductor substrate. In some embodiments the system controller includes program instructions for (i) causing an introduction of a molybdenum-containing precursor to the processing chamber, wherein the molybdenum-containing precursor includes molybdenum and at least one organic ligand bound to molybdenum, wherein the organic ligand includes at least one of N, O, and S; and (ii) causing the molybdenum-containing precursor to react and form a molybdenum containing layer on the semiconductor substrate. In some embodiments the molybdenum-containing precursor includes molybdenum and at least one sulfur-containing ligand bound to molybdenum.

In another aspect, a non-transitory computer machine-readable medium comprising program instructions for control of a deposition tool is provided, where the program instructions include code for causing any of the methods described herein.

The methods and apparatuses described herein can be integrated with the processes and apparatuses that perform photolithographic patterning. In one aspect, a system is provided, where the system includes any apparatus described herein and a stepper.

The molybdenum-containing precursors described herein can be used in ALD and CVD for deposition of molybdenum-containing films in a variety of applications. In some embodiments, the precursors are used to form conformal films. In other embodiments the precursors are used to fill recessed features with molybdenum-containing material (e.g., with molybdenum metal). For example, provided precursors and methods can be used for filling contact holes with high purity molybdenum metal. Provided precursors can be used to deposit high purity molybdenum having low levels of incorporation of other elements, such as O, N, and S.

These and other aspects of implementations of the subject matter described in this specification are set forth in the accompanying drawings and the description below.

DETAILED DESCRIPTION OF THE PREFERRED EMBODIMENTS

Figure 1A:
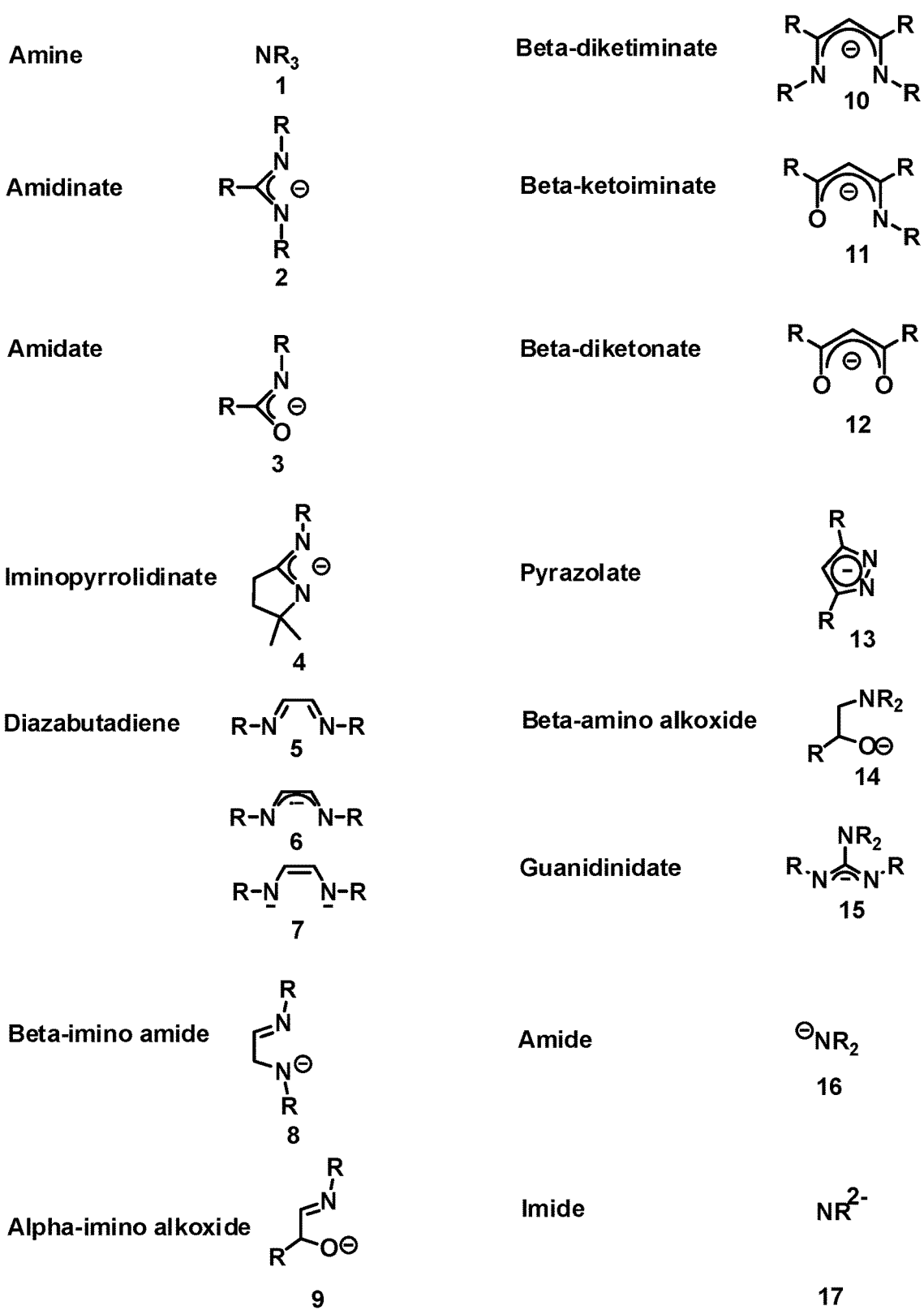
FIG. 1A provides examples of ligands that can be used in molybdenum precursors according to an embodiment provided herein.
Figure 1B:
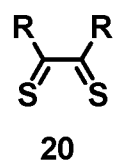
FIG. 1B provides examples of sulfur-containing ligands that can be used in molybdenum precursors according to an embodiment provided herein.
Figure 1B:
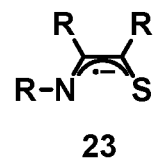
Figure 1B:
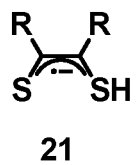
Figure 1B:
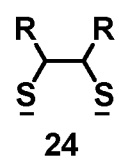
Figure 1B:
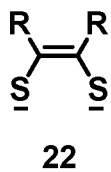
Figure 1B:
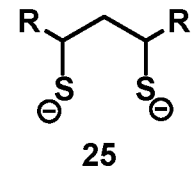

Methods and precursors for depositing molybdenum-containing films on semiconductor substrates are provided. These methods and precursors can be used, for example, for depositing a blanket molybdenum-containing layer on a planar substrate, for depositing a conformal molybdenum-containing layer on a substrate having one or more recessed or protruding features, and for filling recessed features with molybdenum-containing materials. In some embodiments, methods and precursors are provided for selectively depositing molybdenum-containing layers over dielectric in a presence of exposed metal, or for selectively depositing molybdenum-containing layers over metal in a presence of exposed dielectric.

The methods can be used for deposition of a variety of molybdenum-containing materials including, but not limited to molybdenum metal, molybdenum nitride ($MoN_x$), molybdenum carbide ($MoC_x$), molybdenum boride ($MoB_x$), molybdenum silicide ($MoSi_x$), molybdenum boride carbide ($MoB_xC_y$), and molybdenum carbonitride ($MoC_xN_y$), where x and y indicate that the stoichiometry of these compounds may vary. Provided precursors are particularly suitable for deposition of molybdenum metal, such as high purity molybdenum metal with low levels of incorporation of other elements.

"Molybdenum metal" or "metallic molybdenum" as used herein, refers to material that consists essentially of molybdenum (Mo). Other elements (e.g., C, N, or O) can be present in molybdenum metal in small quantities (e.g., with a total content of less than about 15 atomic %, or less than about 10%, where hydrogen is not included in the calculation). "High purity molybdenum metal" as used herein refers to molybdenum metal that includes less than about 5% of other elements, such as less than about 1% of other elements, where hydrogen is not included in the calculation.

Molybdenum nitride ($MoN_x$), molybdenum carbide ($MoC_x$), molybdenum boride ($MoB_x$), molybdenum silicide ($MoSi_x$), molybdenum boride carbide ($MoB_xC_y$), and molybdenum carbonitride ($MoC_xN_y$), refer to materials that consist essentially of molybdenum and nitrogen ($MoN_x$), molybdenum and carbon ($MoC_x$), molybdenum and boron ($MoB_x$), molybdenum and silicon ($MoSi_x$), molybdenum, boron and carbon ($MoB_xC_y$), and molybdenum, carbon and nitrogen (MoC$_x$N$_y$), where x and y indicate that the stoichiometry of these compounds may vary. Other elements may be present in these compounds in small quantities, e.g., in an amount of less than about 10% atomic, where hydrogen is excluded from the calculation.

The term "semiconductor substrate" as used herein refers to a substrate at any stage of semiconductor device fabrication containing a semiconductor material anywhere within its structure. It is understood that the semiconductor material in the semiconductor substrate does not need to be exposed. Semiconductor wafers having a plurality of layers of other materials (e.g., dielectrics) covering the semiconductor material, are examples of semiconductor substrates. The following detailed description assumes the disclosed implementations are implemented on a semiconductor wafer, such as on a 200 mm, 300 mm, or 450 mm semiconductor wafer. However, the disclosed implementations are not so limited. The work piece may be of various shapes, sizes, and materials. In addition to semiconductor wafers, other work pieces that may take advantage of the disclosed implementations include various articles such as printed circuit boards and the like.

The term "about" when used in reference to numerical values includes a range of ±10% of the recited numerical value, unless otherwise specified.

The term "alkyl", as used herein, refers to saturated substituents containing exclusively carbon and hydrogen atoms. Alkyls include both linear, branched and cyclic groups. Examples of linear alkyl groups include without limitation. methyl groups, ethyl groups, n-propyl groups, n-butyl groups, etc. Examples of branched alkyls groups include without limitation, isopropyl, isobutyl, ser-butyl, and t-butyl, Examples of cycloalkyls include without limitation, cyclopropyl groups, cyclopentyl groups, cyclohexyl groups, etc.

The term "fluoroalkyl", as used herein, refers alkyl groups containing one or more fluorine substituents. In some implementations fluoroalkyls contain exclusively fluorine substituents, such as in $CF_3$, $C_2F_5$, $C_3F_7$. Fluoroalkyls may be linear. branched and cyclic.

The term "alkylsilyl", as used herein, refers to $SiR_3$ group, wherein at least one R is an alkyl, and each R is independently selected from H and an alkyl. Alkylsilyls include mono, his, and tris alkylsilyls. Examples of alkylsilyls include trimethylsilyl, dimethylsilyl, methylsilyl, triethylsilyl, diethylsilyl, and ethylsilyl.

The term "alkylamino", as used herein, refers to $NR_2$ group, wherein at least one R is an alkyl, and each R is independently selected from H and an alkyl. Examples of alkylamino substituents include dimethylamino and diethylamino substituents.

The term "alkoxy", refers to an OR, group, where R is an alkyl. Examples of alkoxy groups include methoxy, ethoxy, propoxy groups.

The term "independently selected", when referring to R substituent selection in a molecule containing multiple R groups, means that the selection of R substituents at different atoms of a molecule is independent and that the selection of R substituents at one atom having multiple R substituents is also independent.

Molybdenum metal films have not been widely used in semiconductor processing, at least in part because molybdenum has a high affinity towards carbon, nitrogen, and oxygen, making it difficult to obtain molybdenum metal having low levels of incorporation of impurities, and, consequently, low resistivity. Many common molybdenum deposition precursors display low thermal stability, which results in insufficient step coverage in high aspect ratio features. Existing organometallic molybdenum precursors with molybdenum-carbon bonds can provide high levels of incorporation of carbon into the deposited molybdenum leading to high resistivity. For example, the use of molybdenum carbonyl compounds, such as $Mo(CO)_6$ can lead to incorporation of large amounts of carbon (e.g., at least 5 atomic %) into the growing molybdenum metal film, because molybdenum serves as a catalyst for CO dissociation. While molybdenum halides do not have this problem, the existing halide-based molybdenum-containing deposition precursors have a number of other undesirable properties. For example, the use of molybdenum hexafluoride ($MoF_6$) requires fluorine barrier and an etch stop layer, when molybdenum is deposited on a substrate containing exposed fluorine-susceptible layers (e.g., silicon-containing materials, such as silicon oxide-based dielectrics). Molybdenum pentachloride ($MoCl_5$) is another conventional precursor that has a number of drawbacks: it has a high melting point and may induce etching of the growing molybdenum film. Modifying the homoleptic halide precursors by exchanging halide ligands for oxo ligands, as in molybdenum oxychlorides $MoOCl_4$ and $MoO_2Cl_2$, increases volatility, but these precursors are difficult to reduce to the pure molybdenum metal due to strong molybdenum-oxygen double bonds. In addition, $MoCl_5$, $MoOCl_4$, and $MoO_2Cl_2$ are all high melting point corrosive solids, which are undesirable in high volume manufacturing.

Molybdenum precursors and deposition methods provided herein, can overcome one or more of these shortcomings. In some embodiments, high purity molybdenum metal films are deposited using provided precursors and methods, wherein the deposited high purity molybdenum metal film consists essentially of molybdenum, and has less than about 5% atomic of other elements, such as less than about 3% atomic of other elements, or less than about 1% atomic of other elements (excluding hydrogen from the calculation). In some embodiments molybdenum metal films with resistivities of less than about 50 $\mu\Omega$·cm, such as less than about 30 $\mu\Omega$·cm for 100 Å thick films are provided. In some embodiments, particularly when fluorine-free precursors are used, the molybdenum metal can be deposited directly onto a substrate containing exposed fluorine-sensitive materials, without the need for protecting them with an etch stop layer. For example, molybdenum metal or other molybdenum-containing films can be deposited onto a substrate containing exposed silicon oxide based dielectric, silicon-containing dielectrics, such as silicon nitride and silicon carbide, or amorphous or crystalline silicon or silicon germanium. Silicon oxide based dielectrics, as used herein, refer to dielectrics containing silicon-oxygen bonds, and include thermally grown silicon oxide, silicates, TEOS (tetraethylorthosilicate)-deposited oxide and the like.

The precursors provided herein are selected such that they can be easily reduced to molybdenum metal, and preferably do not include molybdenum-oxygen double bonds. Further, they are amenable to vaporization and are stable at target temperatures and pressures. For example, in some embodiments the precursors are used in deposition reactions at temperatures of less than about 450° C. such as less than about 400° C.

In order to maintain appropriate volatility, in many embodiments discussed herein, the precursors having molecular weights of less than about 450 g/mol, such as less than about 400 g/mol are selected.

Generally, molybdenum precursors can include molybdenum in a wide range of oxidation states ranging from 0 to +6.

In some embodiments molybdenum compounds with molybdenum in low oxidation states +3, +4 and +5 are preferred.

Halide-Containing Heteroleptic Molybdenum Compounds

In one aspect, halide-containing heteroleptic molybdenum compounds (i.e., compounds having different types of ligands) are used as precursors for deposition of molybdenum-containing films, such as for deposition of molybdenum metal, molybdenum nitride or molybdenum carbide. In one embodiment, the precursor is a compound that includes molybdenum, at least one halide forming a bond with molybdenum, and at least one organic ligand having any of the N, O, and S elements, where an atom of any of these elements forms a bond with molybdenum. Examples of suitable organic ligands that provide nitrogen or oxygen bonding include amidinates, amidates, iminopyrrolidinates, diazadienes, beta-imino amides, alpha-imino alkoxides, beta-amino alkoxides, beta-diketiminates, beta-ketoiminates, beta-diketonates, amines, and pyrazolates. Examples of suitable organic ligands that provide sulfur bonding include thioethers, thiolates, dithiolenes, dithiolates, and α-imino thiolenes. These ligands may be substituted or unsubstituted. In some embodiments, these ligands include one or more substituents independently selected from the group consisting of H, alkyl, fluoroalkyl, alkylsilyl, alkylamino, and alkoxy substituents. The organic ligands can be neutral or anionic (e.g., monoanionic or dianionic), and molybdenum can be in a variety of oxidation states, such as +1, +2, +3, +4, +5, and +6.

Figure 2:
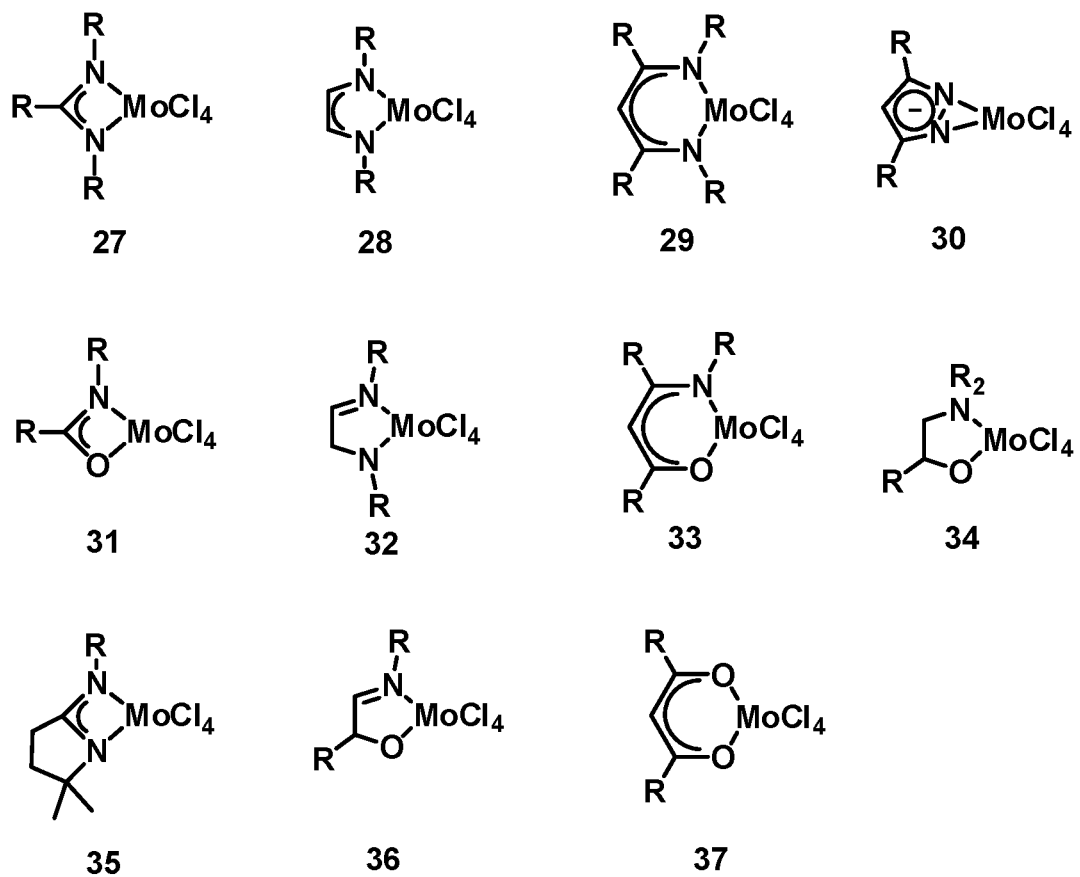
FIG. 2 lists examples of molybdenum precursors according to an embodiment provided herein.

Structures of exemplary suitable N and/or O containing organic ligands 1-17 are shown in FIG. 1, and structures of exemplary suitable S-containing organic ligands 18-26 are shown in FIG. 2, where each R is independently selected from H, alkyl. fluoroalkyl, alkylsilyl, alkylamino, and alkoxy. In some embodiments, each R is independently selected from H, alkyl, and fluoroalkyl. In some embodiments each R is independently selected from H, methyl, ethyl, n-propyl, isopropyl, isobutyl, n-butyl, sec-butyl, t-butyl, pentyl, hexyl, cyclopropyl, cyclobutyl, cyclopentyl, cyclohexyl, cyclopropylmethyl, cyclopropylethyl, cyclopropylpropyl, cyclobutylmethyl, and cyclobutylethyl. In some embodiments each R is an independently selected alkyl. In some embodiments ligands with branched alkyl substituents, such as isopropyl, and isobutyl are preferred, because such ligands provide more volatile molybdenum precursors.

In some embodiments at least one organic ligand in the precursor is an amine. Suitable amines include unidentate amines (e.g., monoalkylamines, dialkylamines), bidentate amines (e.g., unsubstituted or N-alkyl substituted ethylenediamines), and amines of higher denticities (e.g., substituted or unsubstituted diethylenetriamine). An example of a monodentate amine is amine 1, shown in FIG. 1, where at least one R is an alkyl or fluoroalkyl, and each R is independently selected from the group consisting of H, alkyl, and fluoroalkyl. In some embodiments at least one R is an alkyl, and each R is independently selected from H, and an alkyl. In some embodiments, the at least one organic ligand is an amide, such as a monoanionic amide 16, wherein at least one R is an alkyl or fluoroalkyl, and each R is independently selected from H, alkyl, and a fluoroalkyl. In some embodiments, the at least one organic ligand is an imide, such as a dianionic imide 17, wherein R is an alkyl or fluoroalkyl. While in general imide-containing precursors can be used for deposition of a variety of molybdenum-containing films (including molybdenum metal), in some embodiments they are more preferred for deposition of molybdenum nitride and molybdenum carbonitride, as they form strong molybdenum-nitrogen bonds, and can serve as sources of nitrogen for the resulting film. In some embodiments, at least one organic ligand in the precursor is an amidinate. An example of an amidinate is an amidinate 2 shown in FIG. 1, where each R is independently selected from H, alkyl, and fluoroalkyl. Amidinate 2 is a monoanionic ligand that can form two molybdenum-nitrogen bonds, serving as a bidentate ligand.

In some embodiments, at least one organic ligand in the precursor is an amidate. An example of an amidate is an amidate 3 shown in FIG. 1, where each R is independently selected from H, alkyl, and fluoroalkyl. Amidate 3 is a monoanionic ligand that can form one molybdenum-nitrogen, and one molybdenum-oxygen bond, serving as a bidentate ligand.

In some embodiments, at least one organic ligand in the precursor is a diazadiene. Examples of diazadienes are 1,4-diazabuta-1,3-dienes (DAD) 5, 6, and 7, where each R is independently selected from H, alkyl, and fluoroalkyl. An interesting property of this ligand is that it can exist in neutral form 5, monoanionic radical form 6, and dianionic form 7. Due to redox activity of monoanionic (radical) form 6, it can be relatively easily removed during deposition making complexes of DAD 6 particularly useful for deposition of molybdenum metal and high purity molybdenum metal. DAD ligands 5, 6, and 7 can serve as bidentate ligands, each forming two molybdenum-nitrogen bonds. In some embodiments the molybdenum precursor includes DAD ligand 5, 6, or 7 as an organic ligand, where each R is independently selected from methyl, ethyl, propyl, isopropyl, n-butyl, isobutyl, sec-butyl and t-butyl.

In some embodiments, the at least one organic precursor is an iminopyrrolidinate (such as an iminopyrrolidinate 4, where each R is independently selected from H, alkyl, and fluoroalkyl), a beta-imino amide (such as beta-imino amide 8, where each R is independently selected from H, alkyl, and fluoroalkyl), an alpha-imino alkoxide (such as an alpha-imino alkoxide 9, where each R is independently selected from H, alkyl, and fluoroalkyl), a beta-diketiminate (such as an beta-diketiminate 10, where each R is independently selected from H, alkyl, and fluoroalkyl), a beta-ketoiminate (such as beta-ketoiminate 11, where each R is independently selected from H, alkyl, and fluoroalkyl), a beta-diketonate 12 (such as beta-diketonate 12, where each R is independently selected from H, alkyl, and fluoroalkyl), a pyrazolate (such as pyrazolate 13, where each R is independently selected from H, alkyl, and fluoroalkyl), a beta-aminoalkoxide (such as beta-aminoalkoxide 14, where each R is independently selected from H, alkyl, and fluoroalkyl), or a guadinidate 15 (such as guadinidate 15, where each R is independently selected from H, alkyl, and fluoroalkyl). These are monoanionic ligands that are capable of binding to molybdenum in bidentate manner.

In some embodiments, the at least one organic precursor is a sulfur containing ligand that is capable of forming molybdenum-sulfur bond. In some embodiments the at least one organic ligand in the precursor is a thioether. The term "thioether" is used herein broadly to include to include both unidentate and multidentate (e.g. bidentate or tridentate) thioethers, as well as ligands that contain both thioether and thiolate (or other) moieties. An example of a unidentate thioether is dialkylsulfide $R_2S$, where each R is an alkyl. such as dimethylsulfide, diethylsulfide, diisobutyl sulfide, and the like. An example of a multidentate thioether ligand that also includes thiolate moieties is $(SCH_2CH_2SCH_2CH_2S)^{2-}$ An example of a monodentate thioether is thioether 18, shown in FIG. 2, where each R is independently selected from the group consisting of alkyl, and fluoroalkyl. In some embodiments each R is independently selected from the group consisting of methyl, ethyl, n-propyl, isoropyl, n-butyl, isobutyl, sec-butyl, and t-butyl. In some embodiments, the at least one organic ligand is a thiolate, such as a monoanionic thiolate 19, wherein R is an alkyl or fluoroalkyl. For example, R can be methyl, ethyl, n-propyl, isoropyl, n-butyl, sec-butyl, isobutyl, or t-butyl. In some embodiments the thiolate is a dithiolate, such as dianionic alpha-dithiolate 24, (where each R is independently selected from H, alkyl, and fluoroalkyl) or dianionic beta-dithiolate 25 (where each R is independently selected from H, alkyl, and fluoroalkyl). Dithiolates are capable of forming two molybdenum-sulfur bonds with molybdenum.

In some embodiments, the at least one organic ligand in the precursor is a dithiolene. Examples of dithiolenes are structures 20, 21, and 22, where each R is independently selected from H, alkyl, and fluoroalkyl. This ligand (similarly to DAD) can exist in a neutral form 20, monoanionic radical form 21, and dianionic form 22. Due to redox activity of the monoanionic radical form 21, it can be relatively easily removed during deposition and reduction of molybdenum precursor, making complexes of dithiolene 21 particularly useful for deposition of molybdenum metal and high purity molybdenum metal. Dithiolene ligands 20, 21, and 22 can serve as bidentate ligands, each capable of forming two molybdenum-sulfur bonds. In some embodiments the molybdenum precursor includes dithiolene ligand 20, 21, and/or 22 as an organic ligand, where each R is independently selected from methyl, ethyl, propyl, isopropyl, n-butyl, sec-butyl, isobutyl, and t-butyl.

In some embodiments, the at least one organic ligand in the precursor is an alpha-iminothiolene, such as structure 23, where each R is independently selected from H, alkyl, and fluoroalkyl. In some embodiments each R substituent at the carbon atoms is independently selected from H, alkyl, fluoroalkyl, alkylsilyl, alkylamino, and alkoxy substituents, while R substituent at the nitrogen is independently selected from an alkyl and fluoroalkyl. In some embodiments R substituent at the nitrogen is independently selected from methyl, ethyl, propyl, isopropyl, n-butyl, sec-butyl, isobutyl and t-butyl. This ligand (similarly to DAD, and dithiolene) has a monoanionic radical form, as shown in structure 23, is redox-active, and easily removable during reduction processes.

In some embodiments, the molybdenum-containing precursor preferably does not include molybdenum-oxygen or molybdenum-nitrogen double bonds. In some embodiments the molybdenum compound does not include concurrently both imide and guanidinidate ligands. In some embodiments the molybdenum compound does not include imide ligands or guanidinate ligands. In some embodiments the molybdenum compound does not include CO, alkyl, or cyclopentadienyl ligands.

In some embodiments the precursor is a compound having a formula $Mo(X)_m(L)_n$, where m is from 1-4, n is from 1-3, each X is a halide independently selected from F, Cl, Br, and I and each L is an organic ligand as described above, e.g., a ligand independently selected from amidinates, amidates, iminopyrrolidinates, diazadienes, beta-imino amides, alpha-imino alkoxides, beta-amino alkoxides, beta-diketiminates, beta-ketoiminates, beta-diketonates, amines, and pyrazolates, thioethers, thiolates, dithiolenes, dithiolates, and α-imino thiolenes. In some embodiments in the named ligands each R is independently selected from H, alkyl, and fluoroalkyl.

Figure 3:
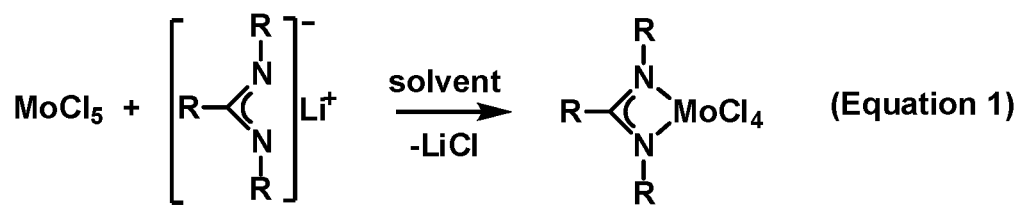
FIG. 3 shows equations of chemical reactions that can be used in the synthesis of molybdenum precursors provided herein.
Figure 3:
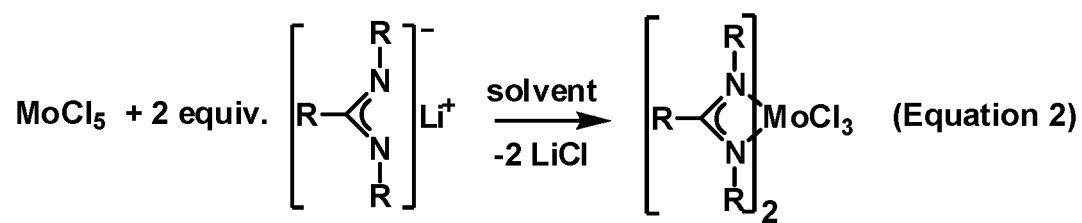

In some embodiments L is a bidentate ligand. Examples of suitable precursors of formula $Mo(L)Cl_4$, that utilize bidentate ligands are shown in FIG. 3. These are Mo(V) compounds and include an amidinate molybdenum complex 27, a DAD complex 28, a beta-diketiminate complex 29, a pyrazolate complex 30, an amidate complex 31, a beta-imino amide complex 32, a beta-ketoiminate complex 33, a beta-amino alkoxide complex 34, an iminopyrrolidinate complex 35, an alpha-imino alkoxide complex 36, and a beta-diketonate complex 37.

Figure 4A:
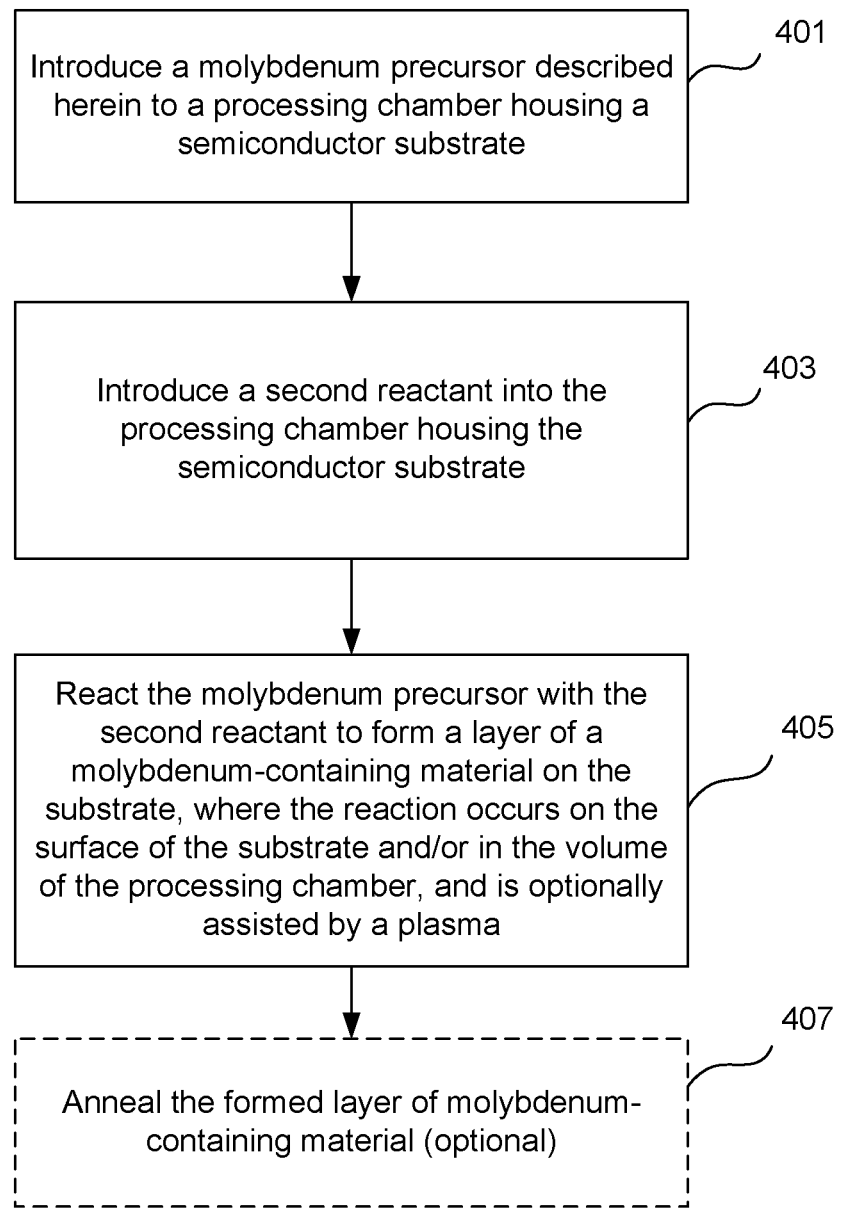
FIG. 4A is a process flow diagram for a method of forming molybdenum-containing films according to an embodiment provided herein.

The heteroleptic complexes with molybdenum-halide bonds and organic ligands described herein can be synthesized using a reaction of molybdenum halide starting materials with the compounds comprising organic ligands in neutral or anionic form. For example molybdenum(V) precursors may be prepared using $MoCl_5$ as a starting material. Mo(III) precursors may be prepared using $MoX_3(THF)_3$ as a starting material, where X is selected from chloride, bromide, and iodide, and THF is tetrahydrofuran. The starting materials can be treated with the ligand in a neutral or anionic form (e.g. a salt, such as lithium or sodium salt), to form the heteroleptic complexes described herein. Examples of reactions that can be used for preparing such complexes are shown in FIG. 4. Equation 1 illustrates preparation of amidinato-tetrachloromolybdenum(V) using a reaction of molybdenum pentachloride with lithium amidinate. Equation 2 illustrates preparation of bis-amidinato-trichloromolybdenum(V) using a reaction of molybdenum pentachloride with two equivalents of lithium amidinate. The stoichiometry of the molybdenum precursors (the number of halides and organic ligands in the resulting precursor) can be controlled by controlling the stoichiometric ratios of starting materials.

The reactions may be conducted in a variety of non-protic solvents. For example the reaction may be conducted in an ether solvent, such as tetrahydrofuran. 2-methyltetrahydrofuran, diethyl ether, methyl-tert-butyl ether, 1,2-dimethoxyethane, in a hydrocarbon solvent such as toluene, benzene, heptane, hexane, pentane, or in a halocarbon solvent such as chlorobenzene, dichlorobenzene, fluorobenzene, difluorobenzene, dichloromethane, chloroform. etc. The reactions can be conducted in a wide temperature range depending on the boiling point of the solvent and on solubility of the products. In some embodiments, the starting materials, reaction intermediates, and the desired products are unstable toward moisture and oxygen. Accordingly. the reaction process should be conducted using anhydrous and air-free conditions using a protective inert gas, such as nitrogen or argon.

The heteroleptic molybdenum compounds containing molybdenum-halide bonds and organic ligands described herein can advantageously provide high purity molybdenum metal in CVD and ALD deposition. Further, the use of these compounds can be associated with reduced etching of the substrate materials as compared with conventional homoleptic molybdenum halides. These advantages are described for illustration purposes and do not limit the use of these compounds solely to molybdenum metal deposition or to deposition on etching-sensitive substrates.

In some embodiments, when deposition is conducted on fluorine-sensitive materials (e.g., silicon-containing materials) the precursors are selected to be fluorine free, e.g., include any of the Cl, Br, and I as the halides in the complex. Further, the use of compounds with fluoroalkyl substituents may be avoided in these embodiments.

Sulfur-Containing Molybdenum Compounds

In one aspect, sulfur-containing molybdenum compounds are used as precursors for deposition of molybdenum-containing films, such as for deposition of molybdenum metal, molybdenum sulfide, molybdenum nitride or molybdenum carbide. In some embodiments, the molybdenum compounds include molybdenum, and at least one sulfur-containing ligand providing molybdenum-sulfur bonding. Molybdenum precursors which are based on sulfur-containing ligands can be used to deposit molybdenum-containing films which are substantially free of impurities due to the ease of removal of sulfur impurities compared to oxygen, carbon, and nitrogen impurities. In some embodiments, the molybdenum compounds do not include molybdenum-carbon bonds and/or do not include molybdenum-oxygen double bonds. In some embodiments the molybdenum compounds do not include molybdenum-nitrogen double bonds. In some embodiments in the provided molybdenum precursors molybdenum forms bonds only with sulfur atoms.

Examples of suitable sulfur-containing ligands that provide sulfur bonding include thioethers, thiolates, dithiolenes, dithiolates, thiocarbamates, and α-imino thiolenes. The ligands can include one or more substituents independently selected from the group consisting of H, alkyl, fluoroalkyl, alkylsilyl, alkylamino, and alkoxy substituents. The ligands can be neutral or anionic (e.g., monoanionic or dianionic), and molybdenum can be in a variety of oxidation states, such as 0, +1, +2, +3, +4, +5, and +6.

In some embodiments the sulfur-containing ligands are ligands 18-25 shown in FIG. 2. where R substituents are as previously described. Examples of suitable molybdenum precursors include molybdenum thiolates $Mo(SR)_4$, wherein R is an alkyl, e.g., methyl, ethyl propyl, butyl. In one specific example, the precursor is tetrakis(tert-butylthiolato)molybdenum(IV): $Mo(SR)_4$, wherein R is t-butyl. Another example of suitable molybdenum precursors are molybdenum thiocarbamates, such as tetrakis(diethyldithiocarbamato)molybdenum(IV):

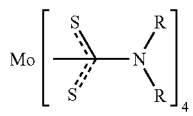

where each R is independently selected from alkyl (e.g., ethyl, methyl, propyl, butyl), and fluoroalkyl (e.g., $CF_3$). In one specific example the precursor is tetrakis(diethyldithiocarbamato)molybdenum(IV).

In some embodiments dithiolene complexes of molybdenum are provided, where dithiolene may be in a neutral form 20, anion-radical form 21, and dianionic form 22, where each R is independently H, alkyl or fluoroalkyl.

Dithiolene complexes are redox-active and can support molybdenum in a variety of oxidation states. Redox reactions of dithiolene ligands 20, 21, and 22 are shown in Equation 3:

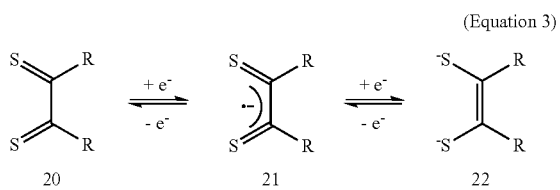

(Equation 3)

In one implementation, the precursor is $Mo(21)_3$, where each R in 21 is independently selected from H, alkyl, and fluoroalkyl. For example, R may be methyl, ethyl, $CF_3$, etc. This is a homoleptic Mo(III) compound containing exclusively molybdenum-sulfur bonds.

In some embodiments, the ligands may provide nitrogen bonding in addition to sulfur bonding. One example of such ligand is alpha-iminothiolene 23, which is a redox-active radical anion ligand that can exhibit behavior similar to that of thiolenes. In some embodiments the precursor is Mo(III) compound $Mo(23)_3$, where each R in compound 23 is independently selected from H, alkyl, and fluoroalkyl.

In some embodiments. the precursor is $MoL_n$ compound, where n is from 2 to 6, and L is a sulfur-containing ligand, such as any of the sulfur-containing ligands described herein. In some embodiments each L is the same sulfur-containing ligand. In other embodiments the precursor may include different sulfur containing ligands L. Examples of precursors include $Mo(19)_2$, $Mo(19)_3$, $Mo(19)_4$, $Mo(19)_5$, $Mo(19)_6$, $Mo(19)_2(18)_2$, $Mo(19)_3(18)$, $Mo(19)_4(18)_2$, $Mo(21)_3$, $Mo(20)(21)_2$, $Mo(22)_3$, $Mo(21)(22)_2$, $Mo(20)(22)_2$, $Mo(23)_3$, $Mo(24)_3$, $Mo(25)_3$. The sulfur-containing molybdenum compounds described herein can be synthesized using a reaction of molybdenum halide starting materials with the compounds comprising organic sulfur-containing ligands in neutral or anionic form. For example molybdenum(V) precursors may be prepared using $MoCl_5$ as a starting material. Mo(III) or Mo(IV) precursors may be prepared using corresponding halides or $MoX_3(L)_3$ or $MoX_4(L)_2$ as a starting material, where X is selected from chloride, bromide, and iodide, and L is a neutral Lewis base such as tetrahydrofuran or diethyl ether. The starting materials can be treated with the desired sulfur-containing ligand in a neutral or anionic form (e.g. a salt, such as lithium or sodium salt), to form the sulfur-containing complexes described herein.

In one example, Mo(IV) thiolato complexes are prepared by reacting molybdenum tetrachloride with lithium thiolates. For example $MoCl_4$ can be reacted with t-BuSLi in 1,2-dimethoxythane solvent to form $Mo(t-BuS)_4$ compound.

α-Iminothiolene ligands can be prepared from the corresponding α-iminoketone by thionation using a suitable reagent such as Lawesson's reagent. The radical anionic form of the α-iminothiolene can be prepared subsequently by treatment with an alkali metal, such as lithium. The resulting ligands and ligand salts can be reacted with molybdenum halides to form α-iminothiolene-containing molybdenum compounds.

Molybdenum complexes can also be prepared using a zero valent starting material such as molybdenum hexacarbonyl. The starting material can be treated with a neutral ligand, such as a thioether (dialkylsulfide), to induce redox neutral ligand exchange. The zero valent starting material can also be treated with a ligand precursor, such as bis(diethylthiocarbamoyl)disulfide or bis(trifluoromethyl)-1,2-dithiete, to induce oxidative addition and form the sulfur-containing complexes described herein.

The reactions may be conducted in a variety of non-protic solvents. For example the reaction may be conducted in an ether solvent, such as tetrahydrofuran, 2-methyltetrahydrofuran, diethyl ether, methyl-tert-butyl ether, 1,2-dimethoxyethane, in a hydrocarbon solvent such as toluene, benzene, heptane, hexane, pentane, or in a halocarbon solvent such as chlorobenzene, dichlorobenzene, fluorobenzene, difluorobenzene, dichloromethane, chloroform, etc. The reactions can be conducted in a wide temperature range depending on the boiling point of the solvent and on solubility of the products. In some embodiments, the starting materials, reaction intermediates, and the desired products are unstable toward moisture and oxygen. Accordingly, the reaction process should be conducted using anhydrous and air-free conditions using a protective inert gas, such as nitrogen or argon.

1,4-Diazabutadiene (DAD) Containing Precursors

In another aspect, DAD-containing molybdenum precursors are provided, DAD can bind to molybdenum in its neutral form 5, in its radical-anionic form 6, and in its dianionic form 7. In some embodiments, homoleptic DAD complexes are provided of formula Mo(DAD)m, where m is from 1 to 3, and each DAD is independently selected from neutral DAD 5, radical-anionic DAD 6, and dianionic DAD 7. The oxidation state of molybdenum in these complexes can range from 0 to +6. Non-limiting examples of suitable homoleptic DAD complexes include tris-DAD Mo(III) precursor $Mo(6)_3$, bis-DAD Mo(IV) precursor $Mo(7)_2$, bis-DAD Mo(III) precursor Mo(6)(7), and bis-DAD Mo(II) precursor $Mo(6)_2$.

In some embodiments homoleptic DAD complexes (i.e., compounds having the same ligands) are prepared using a reaction between molybdenum halide and a source of DAD ligand in the required electronic configuration. For example, tris-DAD Mo(III) precursor $Mo(6)_3$ can be synthesized by reacting $MoCh_3$ with three equivalents of the radical anion form of the DAD ligand, which can be prepared from the neutral form of the DAD ligand by treatment with an alkali metal, such as lithium, in a solvent, such as THF, as shown in Equation 4

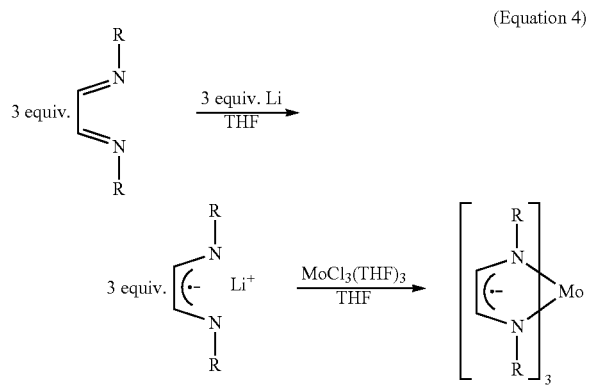

(Equation 4)

In some embodiments, heteroleptic DAD-containing molybdenum compounds are provided. In some implementations the precursor includes molybdenum, at least one DAD ligand bound to molybdenum, and at least one second ligand, wherein the DAD may be neutral DAD 6, radical anionic DAD 7, or dianionic DAD 8, and the second ligand is independently selected from anionic ligands and neutral ligands. In some embodiments the precursor does not contain CO ligands as the only second ligands. In some embodiments the precursor is $Mo(DAD)_m(L)_n(X)_p$, where L is a neutral Lewis base ligand and each L is independently selected from CO, an amine, a phosphine, a thioether, a nitrile, and an isonitrile, and X is an anionic ligand, and each X is independently selected from a halide, an alkyl, an allyl, and a cyclopentadienyl, and m is 1-3, n is 0-4, and p is 0-4. Nitriles are RCN compounds, where R is an alkyl. Isonitriles are RNC compounds, where R is an alkyl, Other suitable anionic ligands include alkoxides, amides, imides, and any other anionic ligands that include a donor atom chosen from C, N, O, B, S, Si, Al, and P.

Examples of heteroleptic DAD-containing precursors include without limitation $Mo(7)_2(RCN)Cl$, $Mo(7)_2(RNC)Cl$, $Mo(8)(CO)_3$, $Mo(6)(13)Cl$, $Mo(6)(18)Cl_2$, $Mo(6)_2Cl$, $Mo(6)_2(14)$, $Mo(6)_2(19)$, $Mo(6)_2(24)$.

Heteroleptic DAD-containing precursors can be prepared by sequential salt metathesis reactions in one pot or using multiple steps. Molybdenum halide starting materials such as Mo(V), Mo(IV), or Mo(III) halides can be treated with anionic forms of a DAD ligand or other anionic ligands. Neutral Lewis base ligands can be exchanged using thermal treatment or photoexcitation.

Heteroleptic DAD-containing precursors can also be prepared using a zero valent molybdenum starting material, such as molybdenum hexacarbonyl, which can undergo oxidative addition with redox active ligands, such as DAD ligands.

In some embodiments, the precursors containing radical anionic DAD ligand 8 are particularly preferred for deposition of molybdenum metal and high purity molybdenum metal. In the radical anionic form 7, the DAD ligand is electronically coupled to vacant molybdenum d-orbitals and is believed to serve as a source of electrons which reduce the molybdenum ions to the zerovalent metallic state. After ligand-to-metal electron transfer, the volatile, neutral DAD ligand 6 can be purged away from the molybdenum metal growth surface. Since the DAD ligand can be removed intact from the growth surface, incorporation of impurity elements such as C and N are reduced when using DAD precursors as compared to other metalorganic precursors. Therefore, molybdenum precursors containing radical anionic DAD ligands can be used for depositing high purity molybdenum metal at low temperatures.

Di-Molybdenum Precursors

In another aspect, precursors for deposition of molybdenum-containing films are di-molybdenum compounds containing a molybdenum-molybdenum bond (e.g., a multiple molybdenum-molybdenum bond, such as a double bond, or any multiple bond with a bond order of 2-5). Such precursors are particularly useful for deposition of molybdenum metal and high purity molybdenum metal because it is easier to reduce such compounds to metallic molybdenum than many mononuclear molybdenum compounds.

In some embodiments, a precursor for deposition of molybdenum-containing films is provided, wherein the precursor is $Mo_2L_n$, wherein each L is independently selected from amidate, amidinate, and guanidinate ligands, n is 2-5, and where the precursor includes a multiple molybdenum-molybdenum bond. In some embodiments each L is independently selected from an amidinate ligand 2, amidate ligand 3, and a guanidinate ligand 15, wherein each R in the amidinate, amidate, and guanidinate is independently selected from H, alkyl, fluoroalkyl, alkylsilyl, alkylamino, and alkoxy substituents. In some embodiments each R is independently selected from H, alkyl, and fluoroalkyl. In some embodiments each L is an amidinate and the precursor has a formula $Mo_2(L)_3$ or $Mo_2(L)_4$. In some embodiments each L is an amidinate and the precursor has a formula $Mo_2(L)_3$ or $Mo_2(L)_4$. In some embodiments each L is a guanidinate and the precursor has a formula $Mo_2(L)_3$ or $Mo_2(L)_4$. In these complexes molybdenum has a low oxidation state 2+ (in $Mo_2(L)_3$) and 3+ in ($Mo_2(L)_4$) making these complexes particularly suitable for facile reduction to molybdenum metal.

One exemplary structure of an amidate paddlewheel di-Mo (II) precursor having a quadruple molybdenum-molybdenum bond is shown by structure 38:

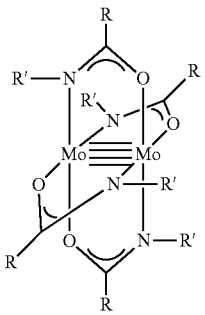

Mo(II) amidate precursor 38

In some embodiments each of R and R' is independently selected from alkyls, such as methyl, ethyl, isopropyl, and t-butyl. In some embodiments one, two, three or four amidate ligands in 38 may be substituted by amidinate or guanidinidate ligands.

Di-molybdenum precursors described herein can be synthesized using dimolybdenum tetraacetate as a starting material by treatment with a ligand salt such as lithium amidate. In one aspect, a container housing any of the precursors described herein in a solid or liquid form is provided. In another aspect a solution of any of these precursors is provided, where the solvent may include, for example, a high boiling point hydrocarbon solvent, such as a higher alkane. In some embodiments a container holding the molybdenum precursor (in solid or liquid form or in solution) is filled with an inert gas, such as nitrogen ($N_2$), or argon (Ar), to prevent contact of the precursor with air, and possible decomposition due to contact with moisture and/or air. In some embodiments the container is adapted for vaporization of the precursor inside the container. For example, the container may include an inlet and an outlet, where the inlet is adapted to be connected with a source of a carrier gas that can be flowed over or through the precursor thereby assisting in precursor vaporization. The outlet is adapted for removing the carrier gas and the precursor vapor from the container and is configured to be connected to a conduit that can be used to deliver the precursor vapor to the processing chamber. The inlet and the outlet each has a closed position and an open position, and, for example, can include manual valves that can be used to switch from closed to open positions and back. When the container is stored or transported the inlet and the outlet are closed. When the container is fitted to the deposition apparatus for use, the inlet and the outlet valves may be open, and a carrier gas may be flown into the inlet, and out from the outlet carrying the precursor vapor. In some embodiments the container has a flow-over design, in which the inlet and the outlet are positioned above the surface of the precursor. For example in a cylindrical container the inlet and the outlet may be positioned at a similar vertical elevation (e.g., the vertical distance between the inlet and the outlet may be less than about 20% of the cylinder height). In other embodiments the container has a bubbler design, in which the inlet is positioned below the surface of the precursor and the outlet is positioned above the inlet (e.g., above the surface of the precursor). For example in a cylindrical container the inlet and the outlet may be positioned far from each other in a vertical direction (e.g., the vertical distance between the inlet and the outlet may be more than about 30%, such as more than about 50%, or more than about 80% of the cylinder height.

Deposition of Molybdenum-Containing Materials

Molybdenum-containing materials can be deposited using the precursors described herein by a variety of deposition methods, such as CVD (including thermal and PECVD), and ALD (including thermal and PEALD). An exemplary method is illustrated by a process flow diagram shown in FIG. 4A. The process starts in 401 by introducing a molybdenum precursor described herein into a process chamber housing the semiconductor substrate. The precursor can be introduced in a vaporized form in a flow of inert gas such as argon, helium, or nitrogen ($N_2$). In operation 403 (which can occur before, after, or during introduction of the molybdenum-containing precursor 401) a second reactant is introduced into the process chamber housing the substrate. In some embodiments, introduction of the molybdenum precursor and of the second reactant is sequential. The chemistry of the second reactant depends on the chemistry of the target molybdenum-containing film. For example for deposition of molybdenum metal, the second reactant is typically a reducing reactant (including reactants that form a reducing environment upon activation in a plasma). Examples of suitable reactants for forming molybdenum metal include hydrogen ($H_2$), ammonia ($NH_3$), hydrazine ($N_2H_4$), an amine, diborane ($B_2H_6$), silane ($SiH_4$, disilane ($Si_2H_6$), an alcohol, hydrogen sulfide ($H_2S$), or a thiol. In some embodiments $H_2$ is a preferred reducing reactant for deposition of molybdenum metal. In some embodiments, the molybdenum-containing precursor is reacted with several reactants sequentially. For example in some embodiments molybdenum metal is deposited by adsorbing a layer of molybdenum-containing precursor on the substrate, reacting it with a second reactant, and then reacting it with a third reactant. In one implementation the molybdenum-containing precursor (a first reactant) is first reacted with at least one of water, $H_2S$, and a thiol (a second reactant). Next, the substrate containing reacted precursor is treated with hydrogen ($H_2$) (a third reactant). In some embodiments the process chamber is purged and/or evacuated after introduction of each of the reactants. In some embodiments, the first reactant (e.g. water, $H_2S$, or thiol) is selected such as to facilitate removal of the ligand from the molybdenum precursor. whereas the third reactant (e.g., $H_2$) is selected to remove the remains of the ligand (e.g., C, N, S, O-containing impurities) from the surface of the substrate and/or to reduce molybdenum to zero oxidation state, and form high purity molybdenum metal.

When molybdenum-containing films, other than molybdenum metal are deposited, the second reactant can be selected such that it serves as a source of necessary elements for the molybdenum-containing film, although in some embodiments these elements may be derived exclusively from the ligand. The process conditions (such as temperature, pressure, reactant flow rates, and optionally, plasma power) can be adjusted to favor a specific film chemistry. For example, borane and silane reactants can be used to deposit molybdenum boride or molybdenum silicide containing materials, in some embodiments, whereas under different conditions, these reactants alone or in combination with other reactants (e.g., $H_2$) may lead to molybdenum metal. For deposition of molybdenum nitride, nitrogen-containing second reactants may be selected in some embodiments and process conditions can be adjusted to allow inclusion of nitrogen into the film. For example, $NH_3$, $N_2H_4$, $N_2$, alkylamines, and alkylhydrazines may be used as a second reactant, for deposition of molybdenum nitride. For deposition of molybdenum carbide, carbon-containing second reactants may be used and process conditions can be adjusted to allow inclusion of carbon into the film. For example, hydrocarbons may be introduced as the second reactant to form molybdenum carbide. Molybdenum carbonitride films can be formed by introducing nitrogen-containing reactants and/or carbon-containing reactants. In some embodiments the nitrogen-containing and carbon-containing ligands of the molybdenum precursor itself can serve as a source of nitrogen and/or carbon. Molybdenum oxide films can be formed by introducing oxygen-containing second reactants, e.g., $O_2$, $O_3$, $N_2O$, $CO_2$, etc. The second reactant may be introduced into the processing chamber in a mixture with an inert carrier gas. such as $N_2$, argon, or helium. Molybdenum sulfide films can be deposited using sulfur-containing reactants or by adjusting process conditions to allow inclusion of sulfur from a sulfur-containing molybdenum precursor into the film. Sulfur-containing reactants include $H_2S$, dialkylsulfides, dialkyldisulfides and thiols such as methanethiol, tert-butylthiol.

In some embodiments the precursor and the second reactant are allowed to mix in the body of the processing chamber. In other embodiments, after the molybdenum precursor has been introduced and has been adsorbed on the surface of the substrate, the processing chamber is purged with an inert gas and/or evacuated to remove the unadsorbed precursor from the process chamber. In some embodiments the layer of the precursor on the substrate is adsorption-limited. In other embodiments a thicker layer of molybdenum precursor can be formed on the surface of the substrate prior to purging and/or evacuation of the process chamber. It is noted that when the precursor and the second reactant are introduced sequentially, the sequence of introduction of the precursor and of the second reactant may be reversed. In some embodiments the second reactant is introduced first and is allowed to adsorb on the surface of the substrate. Then the process chamber is purged and/or evacuated to remove the second reactant from the volume of the process chamber, and the molybdenum precursor is then introduced.

Referring to operation 405, the molybdenum precursor is reacted with the second reactant to form a layer of a molybdenum-containing material on the substrate, where the reaction occurs on the surface of the substrate and/or in the body of the processing chamber, and is optionally assisted by a plasma. For example, in CVD processes the precursor may react with the second reactant in the body of the processing chamber. The reaction may be conducted thermally or with plasma activation. In ALD processes the reaction occurs only on the surface and is limited by the amount of the adsorbed material on the surface (by the amount of molybdenum precursor and/or by the amount of adsorbed second reactant). In surface-limited reactions (such as in ALD) plasma activation is also possible. For example, an adsorbed layer of a molybdenum precursor may be reacted with a plasma formed in a gas that includes a hydrogen-containing second reactant (e.g., $H_2$, $NH_3$, CO, alcohol, etc.) to form a molybdenum metal layer. Generally, the plasma may be generated directly in the process chamber housing the substrate (direct plasma) or remotely in a separate compartment with the resulting plasma-activated species being fed to the process chamber (remote plasma). The temperature during the reaction process can be, for example, between about 20-600° C. Low temperature deposition at about 450° C. or less such as about 400° C. or less, e.g., between about 100-400° C. is conducted in some embodiments and is particularly advantageous for deposition of molybdenum metal. The pressure in the process chamber can be in a range of between about 0.1-100 Torr, such as between about 0.5-5 Torr in PEALD methods and 1-60 Torr in thermal ALD.

After the reaction is completed, the formed molybdenum-containing layer can be optionally annealed as shown in operation 407. Annealing can be performed by increasing the temperature. For example, if the reaction is conducted at a relatively low temperature, e.g., at a temperature of less than about 450° C., such as less than about 400° C., during the anneal the temperature can be increased e.g., by 50-200° C. In some embodiments, annealing is performed at a temperature of between about 300-500° C.

Figure 4B:
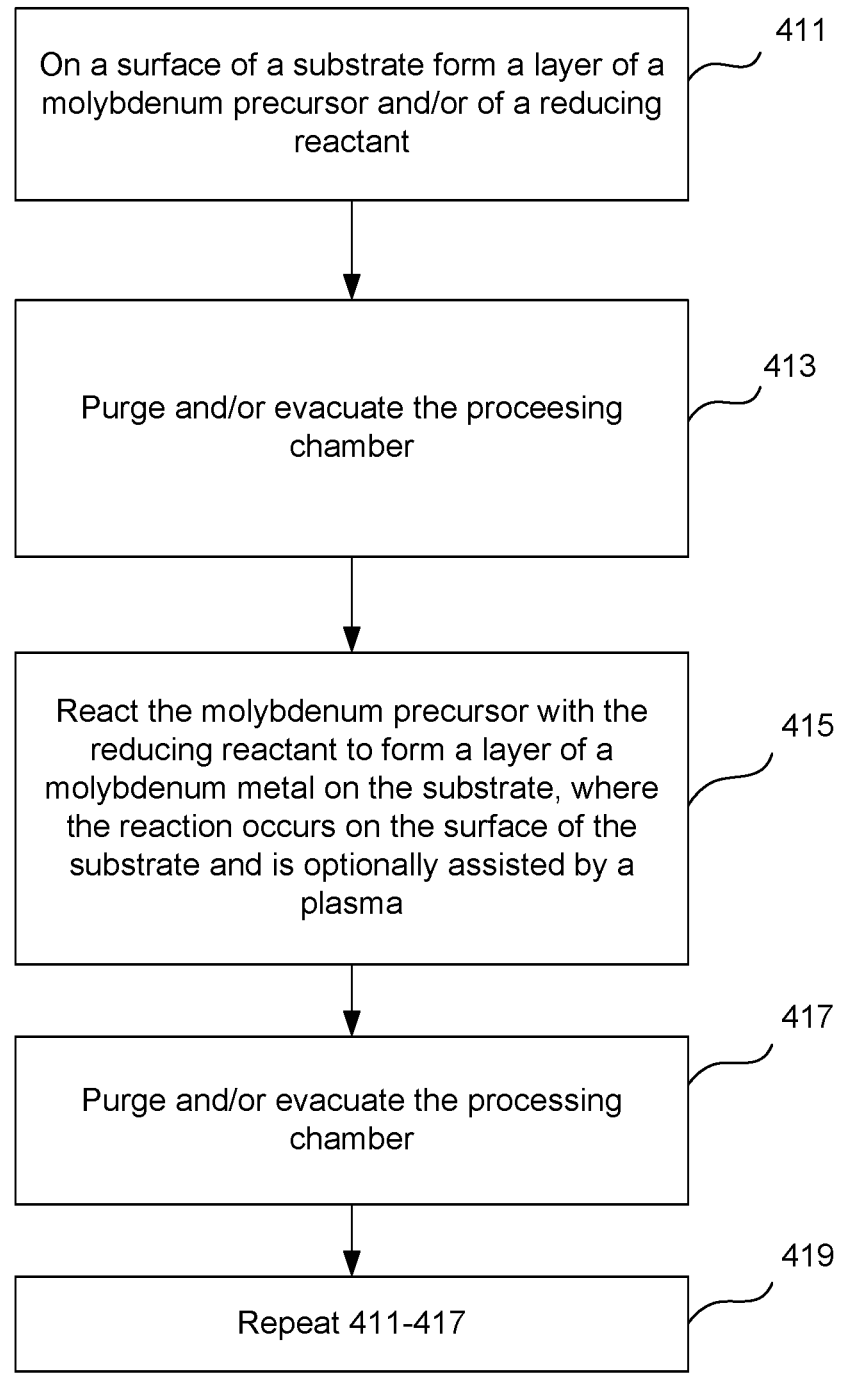
FIG. 4B is a process flow diagram for a method of forming molybdenum metal films according to an embodiment provided herein.

An example of a surface-based deposition process for forming a molybdenum metal film on a substrate is illustrated by a process flow diagram shown in FIG. 4B. In operation 411, a layer of a molybdenum precursor and/or of a reducing reactant is formed on a surface of a substrate. In some embodiments the layer is an adsorption-limited layer. Next in operation 413, the processing chamber is purged and/or evacuated. This step ensures that the molybdenum precursor and/or reducing reactant are present only on the surface of the substrate and not in the volume of the processing chamber. Next, in 415 the molybdenum precursor is reacted with the reducing reactant on the surface of the substrate, optionally with plasma activation. For example, if only molybdenum precursor is adsorbed on the surface of the substrate in 411, a reducing reagent may be introduced into the processing chamber and allowed to react with the molybdenum precursor on the surface. If both the molybdenum precursor and the reducing reactant layers are formed on the surface of the substrate in 411, in 413 the process conditions can be adjusted (e.g., using a plasma treatment of the surface, or temperature increase) to activate the reaction. Next, in 417 the processing chamber is purged and/or evacuated, and in 419 operations 411-417 are repeated to form more molybdenum metal. In some embodiments each cycle of operations 411-417 deposits about 0.1-5.0 Å of molybdenum metal on average. In some embodiments 2-100 cycles are performed. For example 2-20 cycles can be performed. Molybdenum layers of with thicknesses of between about 5-5.000 Å, such as 5-500 Å can be formed with high level of control over layer thickness. This method can be used to form conformal layers of molybdenum metal with excellent step coverage.

Molybdenum-containing films can be deposited on a variety of surfaces including on metals (e.g., copper, nickel, cobalt, tungsten, etc.), dielectrics (e.g., silicon oxide based dielectrics, silicon nitride, silicon carbide, metal oxides, metal nitrides, etc.), and on amorphous and crystalline silicon. In some embodiments molybdenum-containing films (e.g., molybdenum metal) are deposited on a substrate containing an exposed layer of dielectric and an exposed layer of metal.

In some embodiments, molybdenum-containing films are deposited selectively on dielectrics in a presence of exposed metal and, in other embodiments, on metals in a presence of exposed dielectrics. "Selective deposition" as used herein refers to deposition on a target surface at a higher rate than on a non-target surface. In some embodiments the selectivity (the ratio of deposition rate on a target surface to the deposition rate on a non-target surface) is greater than 2, such as greater than 5. In some embodiments molybdenum-containing films are deposited on a dielectric (e.g., silicon oxide based dielectric) without being substantially deposited on exposed metal surfaces.

Figure 5:
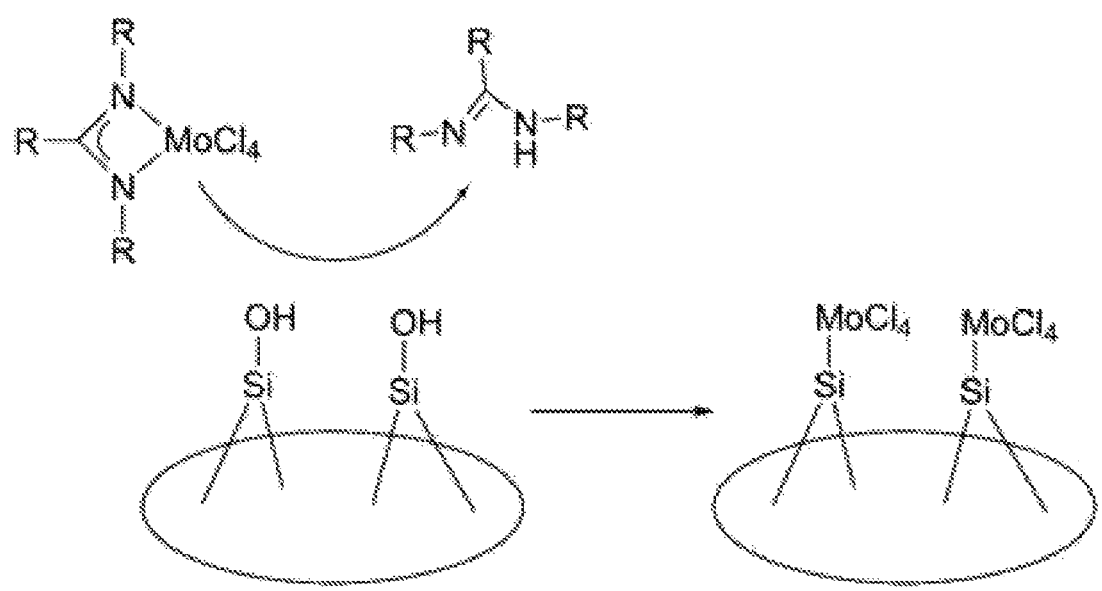
FIG. 5 provides an illustrative reaction that explains selective deposition of molybdenum-containing films on a dielectric in a presence of a metal.

The selectivity for deposition on dielectrics in a presence of metals can be achieved by using molybdenum precursors containing ligands that are efficient proton acceptors. For example ligands containing basic deprotonated nitrogen atoms can be protonated by Si—OH groups on the surface of the substrate, leading to preferential deposition on silicon oxide based dielectrics. Examples of these ligands include amidinates, amidates, iminopyrrolidinates, beta-imino amides, alpha-imino alkoxides, beta-amino alkoxides, beta-diketiminates, beta-ketoiminates, beta-diketonates, and pyrazolates. An illustration of a reaction of a molybdenum amidinate precursor with a dielectric surface containing Si—OH moieties is illustrated in FIG. 5.

Figure 6A:
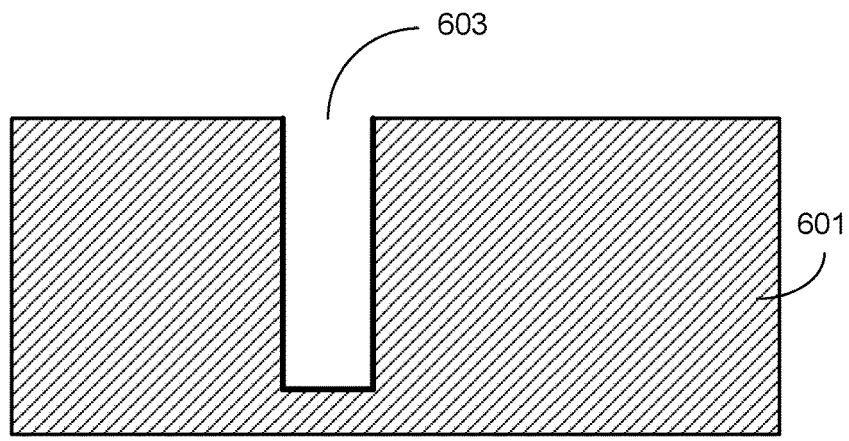
FIGS. 6A-6C illustrate cross-sectional views of a substrate during deposition of molybdenum-containing films according to an embodiment provided herein.
Figure 6B:
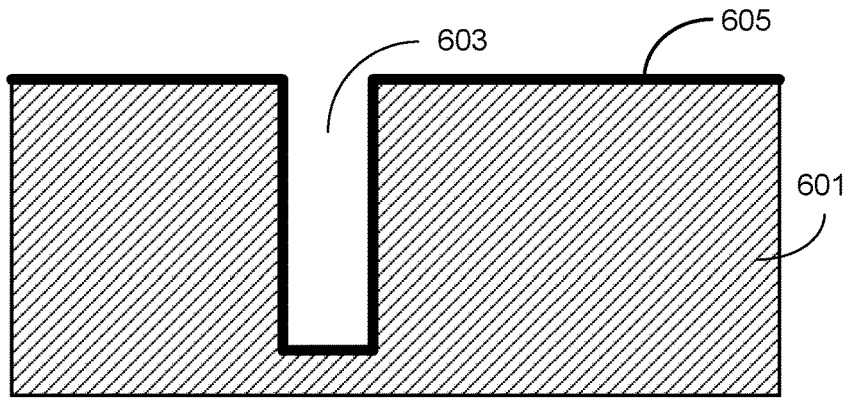
Figure 6C:
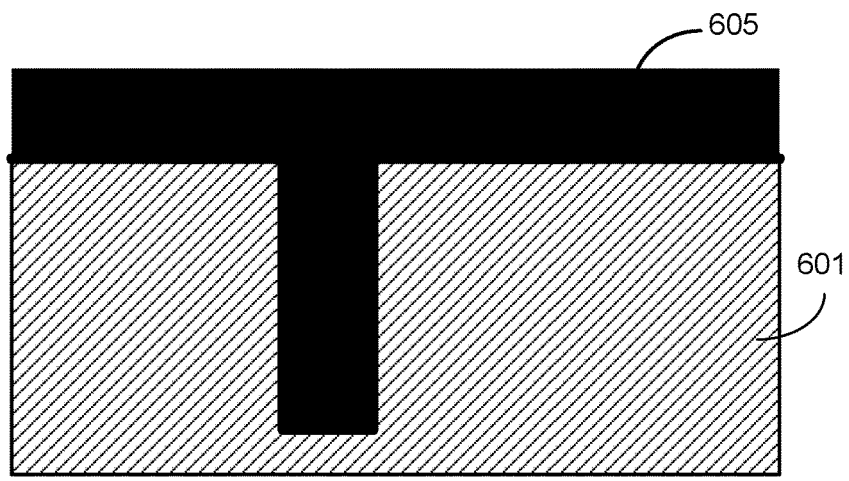

The selectivity for deposition on metals in a presence of dielectrics can be achieved with the use of redox non-innocent ligands, that can serve as electron acceptors. These include radical anion DAD ligand 6, radical anion dithiolene 21 and alpha-iminothiolene 23. In some embodiments, a molybdenum-containing film is selectively deposited on a metal surface in a presence of exposed dielectric by reacting a molybdenum-containing precursor containing a compound of molybdenum with dithiolene 21 radical anion ligand and/or alpha-iminothiolene 23 radical anion ligand to form the molybdenum-containing layer. The R groups in 21 and 23 can be any groups as previously described. In some embodiments each R is independently selected from H, alkyl, and fluoroalkyl. Molybdenum-containing films can be deposited for a variety of applications in semiconductor processing. In some embodiments molybdenum-containing films (e.g., molybdenum metal) is deposited as a conformal layer to a thickness of between about 0.1-10 nm on a substrate containing one or more recessed or protruding features. In some embodiments recessed features are filled with molybdenum-containing material (e.g., molybdenum metal). A schematic presentation of a cross-section of one exemplary substrate is shown in FIG. 6A, which illustrates the substrate 601 having a recessed feature 603. In general, the substrate 601 may include a variety of materials including dielectrics, metals, metal nitrides, etc. A conformal layer of molybdenum-containing material 605 is deposited on the substrate 601 using the methods and precursors described herein (e.g., using ALD). The resulting structure is shown in FIG. 6B. In some applications the process continues, and the recessed feature 603 is filled with the molybdenum-containing material 605 (e.g., with molybdenum metal), as shown in FIG. 6C. The molybdenum-containing film is deposited into the recessed feature, in some embodiments, using multiple depositions of conformal film as shown in FIGS. 6A-6C using a sequence of ALD cycles. In other embodiments the recessed feature may be filled using bottom-up film growth.

The molybdenum-containing films, and, particularly, high purity molybdenum metal, provided herein can be used in interconnect metallization (e.g., for filling recessed features to form contacts), in logic gate applications in FinFETs, as adhesion layers or diffusion barriers, and in 3D NAND fabrication. Examples of applications include logic and memory contact fill, DRAM buried wordline fill, vertically integrated memory gate, and wordline fill, and 3-D integration using through-silicon vias (TSV). The resistivity of molybdenum scales better than that of tungsten, and in some embodiments, molybdenum is particularly advantageous metal for filling narrow recessed features, e.g., features with widths of less than about 20 nm. In one of exemplary applications molybdenum metal is used for manufacturing barrierless contacts. In this application, molybdenum metal is deposited directly into the recessed features (contact holes) having widths of about 5-100 nm, e.g., about 5-20 nm, where the recessed features are formed in the dielectric layer, and include exposed dielectric, such as silicon oxide, silicon nitride, or a low-k material such as silicon oxycarbide at the sidewalls and exposed silicon or silicon germanium at the bottom. In alternative embodiments, the contact hole prior to deposition may be lined with a barrier layer, such as WN, MoN, MoC, or TiN onto which the molybdenum metal is deposited.

Apparatus

The deposition methods described herein can be carried out in a variety of apparatuses. A suitable apparatus includes a processing chamber having one or more inlets for introduction of reactants, a substrate holder in the process chamber configured to hold the substrate in place during deposition, and, optionally, a plasma generating mechanism configured for generating a plasma in a process gas. The apparatus may include a controller having program instructions for causing any of the method steps described herein. The deposition methods described herein may be carried out in corresponding ALD and CVD apparatuses available from Lam Research Corp. of Fremont, CA, such as Altus®, Vector®, and Striker® tools.

For example, in some embodiments the apparatus includes a controller having program instructions that include instructions for: causing an introduction of a molybdenum precursor to the processing chamber, wherein the precursor is any of the precursors described herein; and causing a reaction between the molybdenum precursor and a second reactant to form a layer of molybdenum-containing material on a substrate. The controller may include program instructions for causing any of the methods described herein.

Figure 7:
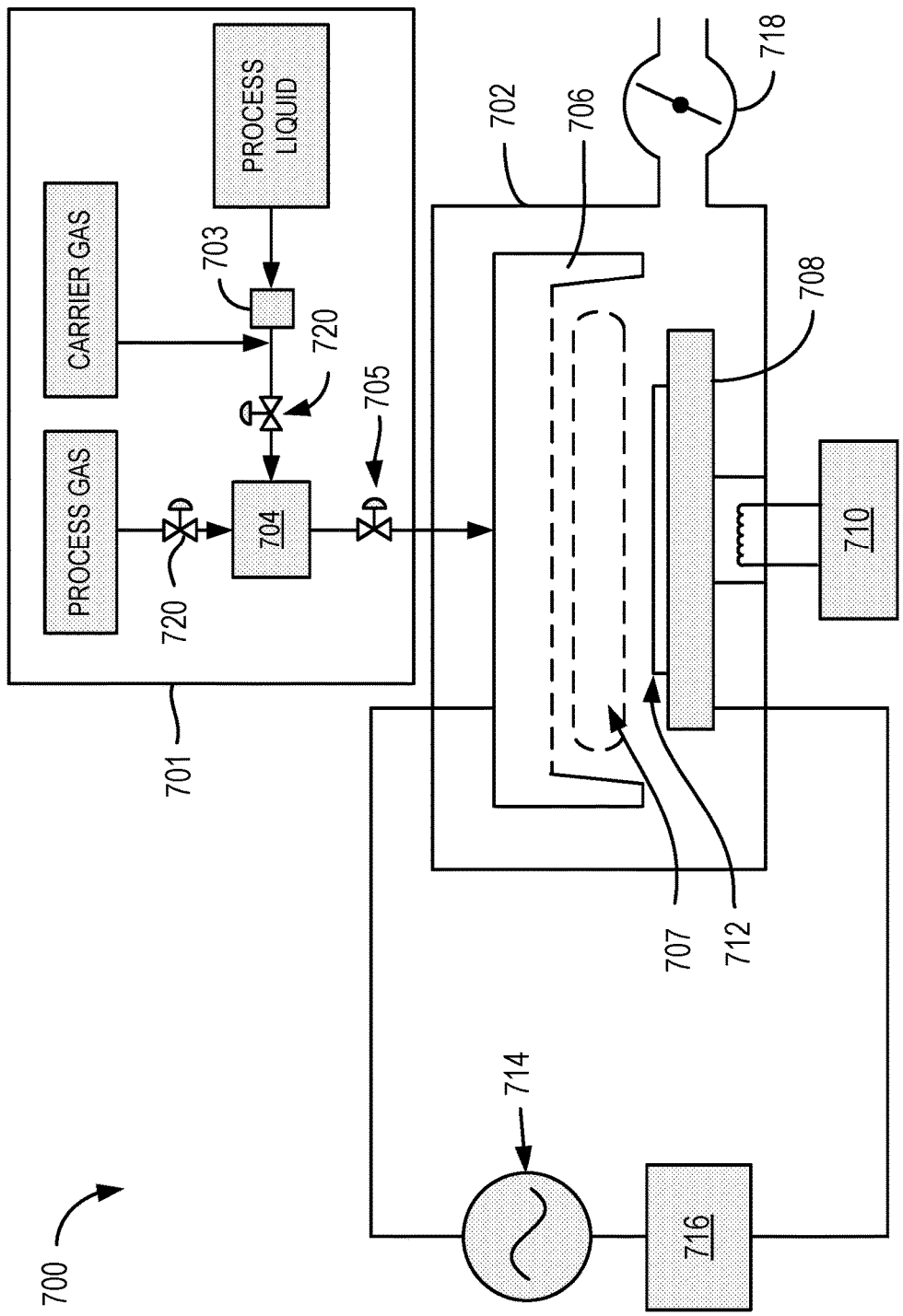
FIG. 7 is a schematic presentation of an apparatus that is suitable for depositing molybdenum-containing films, according to an embodiment provided herein.

An example of a deposition apparatus suitable for depositing molybdenum-containing films using provided methods is shown in FIG. 7. FIG. 7 schematically shows an embodiment of a process station 700 that may be used to deposit material using atomic layer deposition (ALD) and/or chemical vapor deposition (CVD), either of which may be plasma enhanced. For simplicity, the process station 700 is depicted as a standalone process station having a process chamber body 702 for maintaining a low-pressure environment. However, it will be appreciated that a plurality of process stations 700 may be included in a common process tool environment. Further, it will be appreciated that, in some embodiments, one or more hardware parameters of process station 700, including those discussed in detail below, may be adjusted programmatically by one or more computer controllers.

Process station 700 fluidly communicates with reactant delivery system 701 for delivering process gases to a distribution showerhead 706. Reactant delivery system 701 includes a mixing vessel 704 for blending and/or conditioning process gases for delivery to showerhead 706. One or more mixing vessel inlet valves 720 may control introduction of process gases to mixing vessel 704. Similarly, a showerhead inlet valve 705 may control introduction of process gasses to the showerhead 706.

Some molybdenum-containing precursors may be stored in solid or liquid form prior to vaporization and subsequent delivery to the process station. For example, the embodiment of FIG. 7 includes a vaporization point 703 for vaporizing solid reactant to be supplied to mixing vessel 704. In some embodiments, vaporization point 703 may be a heated vaporizer. In some embodiments a flow of an inert gas is passed over the heated solid molybdenum precursor, or bubbled through the heated liquid molybdenum precursor, under subatmospheric pressure, and carries the precursor vapor to the process chamber. The precursor vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 200° C. at mixing vessel 704.

Showerhead 706 distributes process gases toward substrate 712. In the embodiment shown in FIG. 7, substrate 712 is located beneath showerhead 706, and is shown resting on a pedestal 708. It will be appreciated that showerhead 706 may have any suitable shape, and may have any suitable number and arrangement of ports for distributing processes gases to substrate 712. While not explicitly shown, in some embodiments the showerhead 706 is a dual plenum showerhead that includes at least two types of conduits, where the first type of conduit is dedicated to delivery of molybdenum-containing precursor vapor, and the second type of conduit is dedicated to delivery of the second (or other) reactant. In these embodiments the molybdenum-containing precursor and the reactant are not allowed to mix in the conduits prior to entry to the process chamber, and do not share the conduits if delivered to the chamber consecutively.

In some embodiments, a microvolume 707 is located beneath showerhead 706. Performing an ALD and/or CVD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters. This microvolume also impacts productivity throughput. While deposition rate per cycle drops, the cycle time also simultaneously reduces. In certain cases, the effect of the latter is dramatic enough to improve overall throughput of the module for a given target thickness of film.

In some embodiments, pedestal 708 may be raised or lowered to expose substrate 712 to microvolume 707 and/or to vary a volume of microvolume 707. For example, in a substrate transfer phase, pedestal 708 may be lowered to allow substrate 712 to be loaded onto pedestal 708. During a deposition process phase, pedestal 708 may be raised to position substrate 712 within microvolume 707. In some embodiments, microvolume 707 may completely enclose substrate 712 as well as a portion of pedestal 708 to create a region of high flow impedance during a deposition process.

Optionally, pedestal 708 may be lowered and/or raised during portions the deposition process to modulate process pressure, reactant concentration, etc., within microvolume 707. In one scenario where process chamber body 702 remains at a base pressure during the deposition process, lowering pedestal 708 may allow microvolume 707 to be evacuated. Example ratios of microvolume to process chamber volume include, but are not limited to, volume ratios between 1:700 and 1:10. It will be appreciated that, in some embodiments, pedestal height may be adjusted programmatically by a suitable computer controller.

While the example microvolume variations described herein refer to a height-adjustable pedestal, it will be appreciated that, in some embodiments, a position of showerhead 706 may be adjusted relative to pedestal 708 to vary a volume of microvolume 707. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers.

Returning to the embodiment shown in FIG. 7, showerhead 706 and pedestal 708 electrically communicate with RF power supply 714 and matching network 716 for powering a plasma. In other embodiments apparatuses without a plasma generator are used for depositing molybdenum-containing films using provided methods. In some embodiments, the plasma energy may be controlled by controlling one or more of a process station pressure, a gas concentration, a radio frequency (RF) source power, an RF source frequency, and a plasma power pulse timing. For example, RF power supply 714 and matching network 716 may be operated at any suitable power to form a plasma having a desired composition of radical species. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 50 kHz and 700 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some embodiments, pedestal 708 may be temperature controlled via heater 710. Further, in some embodiments, pressure control for deposition process station 700 may be provided by butterfly valve 718. As shown in the embodiment of FIG. 7, butterfly valve 718 throttles a vacuum provided by a downstream vacuum pump (not shown). However, in some embodiments, pressure control of process station 700 may also be adjusted by varying a flow rate of one or more gases introduced to process station 700.

Figure 8:
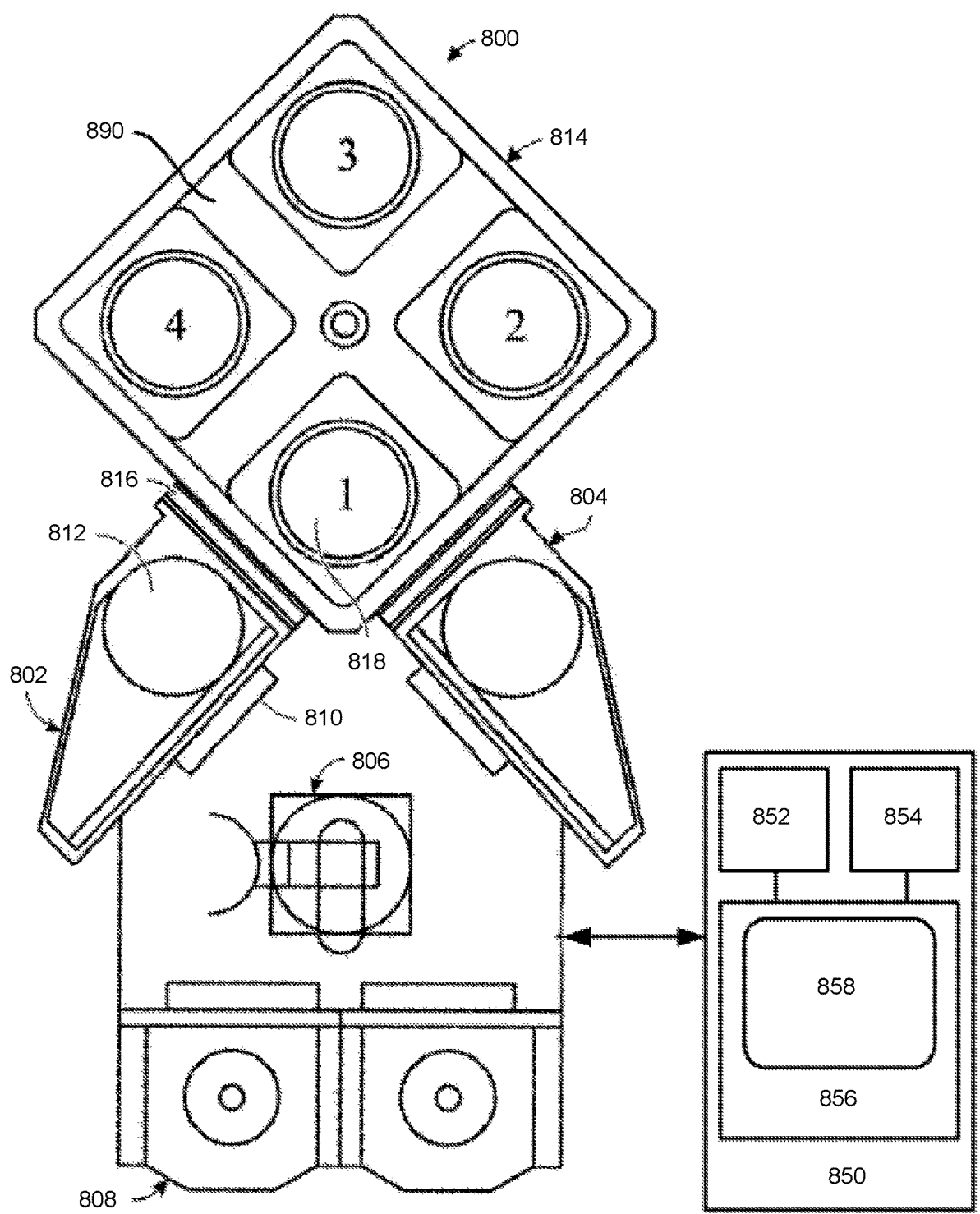
FIG. 8 shows a schematic view of a multi-station processing system according to an embodiment provided herein.

FIG. 8 shows a schematic view of an embodiment of a multi-station processing tool 800 with an inbound load lock 802 and an outbound load lock 804, either or both of which may comprise a remote plasma source. Such tool may be used for processing the substrates using the methods provided herein. A robot 806, at atmospheric pressure, is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 comprises a remote plasma source, the wafer may be exposed to a remote plasma treatment in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 comprises four process stations. numbered from 1 to 4 in the embodiment shown in FIG. 8. Each station has a heated pedestal (shown at 818 for station 1). and gas line inlets. It will be appreciated that in some embodiments, each process station may have different or multiple purposes. While the depicted processing chamber 814 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 also depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. System control software 858 may include instructions for controlling the timing, mixture of gases, chamber and/or station pressure, chamber and/or station temperature, purge conditions and timing, wafer temperature, RF power levels, RF frequencies, substrate, pedestal, chuck and/or susceptor position, and other parameters of a particular process performed by process tool 800. System control software 858 may be configured in any suitable way. For example, various process tool component subroutines or control objects may be written to control operation of the process tool components necessary to carry out various process tool processes in accordance with the disclosed methods. System control software 858 may be coded in any suitable computer readable programming language.

In some embodiments, system control software 858 may include input/output control (IOC) sequencing instructions for controlling the various parameters described above. For example, each phase of an ALD process may include one or more instructions for execution by system controller 850. The instructions for setting process conditions for an ALD process phase may be included in a corresponding ALD recipe phase. In some embodiments, the ALD recipe phases may be sequentially arranged, so that all instructions for a ALD process phase are executed concurrently with that process phase.

Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition and flow rates and optionally for flowing gas into one or more process stations prior to deposition in order to stabilize the pressure in the process station. The process gas control program may include code for controlling gas composition and flow rates within any of the disclosed ranges. A pressure control program may include code for controlling the pressure in the process station by regulating, for example, a throttle valve in the exhaust system of the process station, a gas flow into the process station, etc. The pressure control program may include code for maintaining the pressure in the process station within any of the disclosed pressure ranges.

A heater control program may include code for controlling the current to a heating unit that is used to heat the substrate. Alternatively, the heater control program may control delivery of a heat transfer gas (such as helium) to the substrate. The heater control program may include instructions to maintain the temperature of the substrate within any of the disclosed ranges.

A plasma control program may include code for setting RF power levels and frequencies applied to the process electrodes in one or more process stations, for example using any of the RF power levels disclosed herein. The plasma control program may also include code for controlling the duration of each plasma exposure.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF power levels, frequency, and exposure time), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers. pressure sensors (such as manometers), thermocouples, etc. Appropriately programmed feedback and control algorithms may be used with data from these sensors to maintain process conditions.

Any suitable chamber may be used to implement the disclosed embodiments. Example deposition apparatuses include, but are not limited to, apparatus from the Altus® product family, available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

Figure 9:
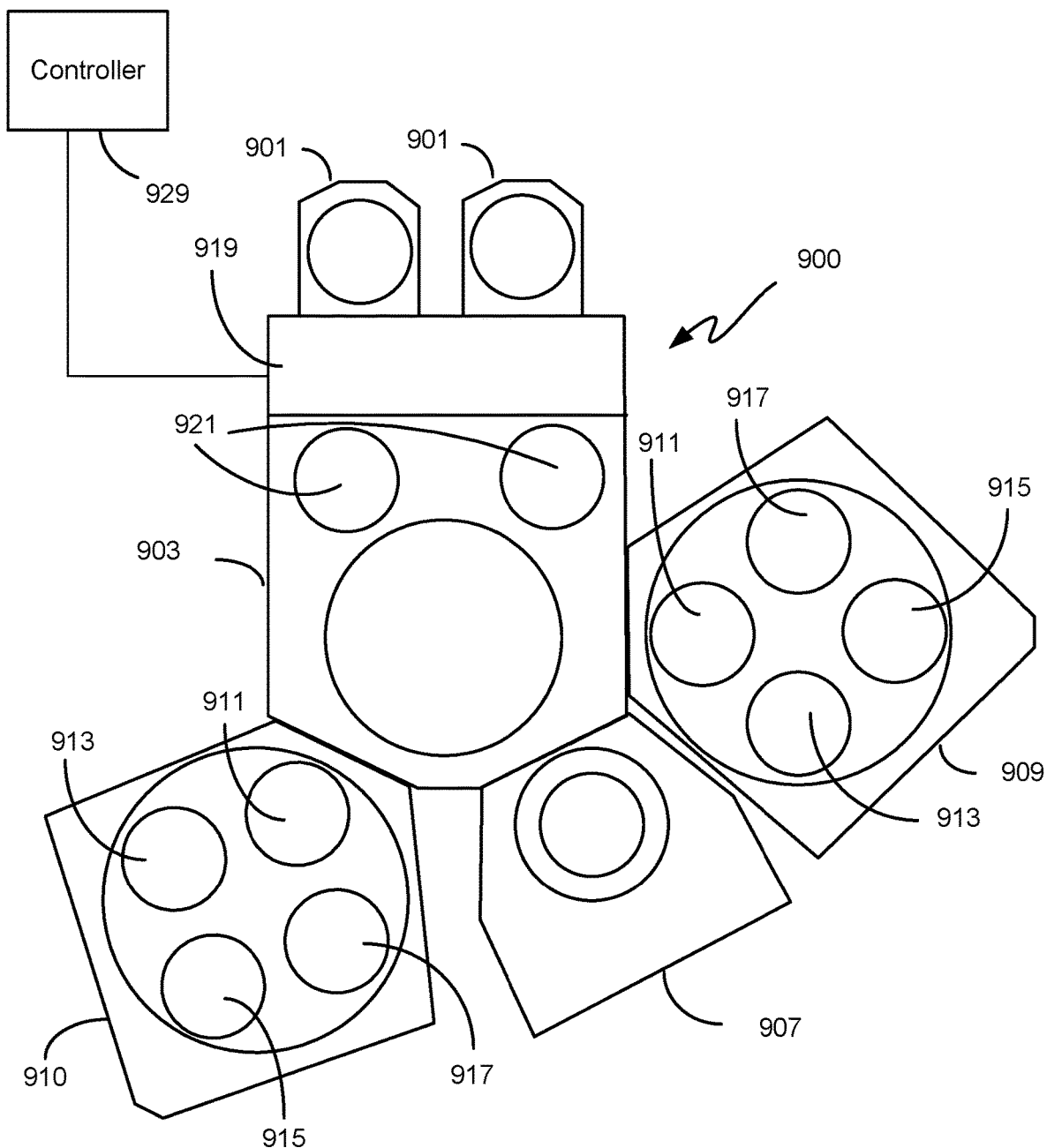
FIG. 9 shows a schematic view of a multi-station processing system according to an embodiment provided herein.

FIG. 9 is a block diagram of a processing system suitable for conducting thin film deposition processes in accordance with certain embodiments. The system 900 includes a transfer module 903. The transfer module 903 provides a clean, pressurized environment to minimize risk of contamination of substrates being processed as they are moved between various reactor modules. Mounted on the transfer module 903 are two multi-station reactors 909 and 910, each capable of performing atomic layer deposition (ALD) and/or chemical vapor deposition (CVD) according to certain embodiments. Reactors 909 and 910 may include multiple stations 911, 913, 915, and 917 that may sequentially or non-sequentially perform operations in accordance with disclosed embodiments. The stations may include a heated pedestal or substrate support, one or more gas inlets or showerhead or dispersion plate.

Also mounted on the transfer module 903 may be one or more single or multi-station modules 907 capable of performing plasma or chemical (non-plasma) pre-cleans. or any other processes described in relation to the disclosed methods. The module 907 may in some cases be used for various treatments to, for example, prepare a substrate for a deposition process. The module 907 may also be designed/configured to perform various other processes such as etching or polishing. The system 900 also includes one or more wafer source modules 901, where wafers are stored before and after processing. An atmospheric robot (not shown) in the atmospheric transfer chamber 919 may first remove wafers from the source modules 901 to loadlocks 921. A wafer transfer device (generally a robot arm unit) in the transfer module 903 moves the wafers from loadlocks 921 to and among the modules mounted on the transfer module 903.

In various embodiments, a system controller 929 is employed to control process conditions during deposition. The controller 929 will typically include one or more memory devices and one or more processors. A processor may include a CPU or computer, analog and/or digital input/output connections, stepper motor controller boards, etc.

The controller 929 may control all of the activities of the deposition apparatus. The system controller 929 executes system control software, including sets of instructions for controlling the timing, mixture of gases, chamber pressure, chamber temperature, wafer temperature, radio frequency (RF) power levels, wafer chuck or pedestal position. and other parameters of a particular process. Other computer programs stored on memory devices associated with the controller 929 may be employed in some embodiments.

Typically there will be a user interface associated with the controller 929. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller 929. The signals for controlling the process are output on the analog and digital output connections of the deposition apparatus 900.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller 929 is part of a system. which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 929, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings. which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules. other tool components, cluster tools, other tool interfaces, adjacent tools, neighboring tools, tools located throughout a factory, a main computer. another controller, or tools used in material transport that bring containers of wafers to and from tool locations and/or load ports in a semiconductor manufacturing factory.

Further Implementations

The apparatus and processes described herein may be used in conjunction with lithographic patterning tools or processes, for example, for the fabrication or manufacture of semiconductor devices, displays, LEDs, photovoltaic panels, and the like. Typically, though not necessarily, such apparatus and processes will be used or conducted together in a common fabrication facility. Lithographic patterning of a film typically comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

What is claimed is:
1. A method of forming a molybdenum-containing layer on a semiconductor substrate, the method comprising:
 (a) introducing a molybdenum-containing precursor into a process chamber housing the semiconductor substrate, wherein the molybdenum-containing precursor is $Mo_2L_n$, wherein each L is independently selected from the group consisting of an amidate, an amidinate and a guanidinate ligands, wherein n is 2-5, and wherein the molybdenum-containing precursor comprises a multiple molybdenum-molybdenum bond; and
 (b) reacting the molybdenum-containing precursor to form a molybdenum-containing layer on the semiconductor substrate.

2. The method of claim 1, wherein the molybdenum-containing layer is molybdenum metal.

3. The method of claim 1, wherein the molybdenum-containing precursor is $MO_2L_n$, wherein each L is independently an amidinate or a guanidinate ligand, n is 2-5, wherein the amidinate ligand is:

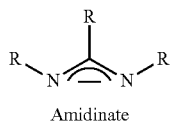

Amidinate wherein each R is independently selected from the group consisting of of H, alkyl, fluoroalkyl, alkylsilyl, alkylamino, and alkoxy substituents, and wherein the the guanidinidate ligand is:

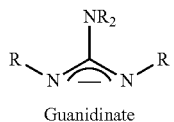

Guanidinate wherein each R is independently selected from the group consisting of of H, alkyl, fluoroalkyl, alkylsilyl, alkylamino, and alkoxy substituents.

4. The method of claim 1, wherein the molybdenum-containing precursor is $Mo_2L_3$ or $Mo_2L_4$, wherein L is the amidinate.

5. The method of claim 1, wherein the molybdenum-containing precursor is $Mo_2L_3$ or $Mo_2L_4$, wherein L is a guanidinate.

6. The method of claim 1, wherein (b) comprises reacting the molybdenum-containing precursor with hydrogen ($H_2$).

7. The method of claim 1, wherein (b) comprises reacting the molybdenum-containing precursor with at least one reactant selected from the group consisting of hydrogen ($H_2$), ammonia ($NH_3$), diborane ($B_2H_6$), water, $H_2S$, a thiol, an alcohol, an amine, hydrazine, silane ($SiH_4$) and disilane ($Si_2H_6$) to form a layer of molybdenum metal.

8. The method of claim 7, wherein the molybdenum metal is deposited by thermal ALD or PEALD.

9. The method of claim 1, wherein the molybdenum-containing layer is deposited conformally onto a substrate having a recessed feature.

10. A method of forming a molybdenum metal layer on a semiconductor substrate, the method comprising:
(a) introducing a molybdenum-containing precursor into a process chamber housing the semiconductor substrate, wherein the precursor is a compound that includes:
molybdenum;
at least one sulfur-containing ligand that forms molybdenum-sulfur bond with molybdenum, wherein the compound does not include molybdenum-carbon bonds, and wherein the at least one sulfur-containing ligand is a dithiolene, alpha iminothiolene, alpha dithiolate or beta dithiolate; and
(b) reacting the molybdenum-containing precursor to form molybdenum metal on the semiconductor substrate.

11. The method of claim 10, wherein in the precursor molybdenum forms only molybdenum-sulfur bonds.

12. The method of claim 10, wherein (b) comprises reacting the molybdenum-containing precursor with a reactant selected from the group consisting of hydrogen ($H_2$), ammonia ($NH_3$), diborane ($B_2H_6$), water, $H_2S$, a thiol, an alcohol, an amine, silane ($SiH_4$), disilane ($Si_2H_6$), and hydrazine, to form a layer of molybdenum metal.

13. The method of claim 10, wherein the reaction in (b) is conducted on a surface of the semiconductor substrate, and wherein the method comprises adsorbing the molybdenum-containing precursor onto the substrate and removing an unadsorbed molybdenum-containing precursor from the process chamber, prior to the reaction, reacting the adsorbed molybdenum-containing precursor with a reactant selected from the group consisting of water, an alcohol, $H_2S$, and a thiol, and, after the reaction, treating the surface of the semiconductor substrate with hydrogen ($H_2$) with or without plasma to form the layer of molybdenum metal.

14. A precursor for deposition of molybdenum-containing films, wherein the precursor is $Mo_2L_n$, wherein each L is independently an amidinate or a guanidinate ligand, n is 2-5, and wherein the precursor comprises a multiple molybdenum-molybdenum bond, wherein the amidinate ligand is:

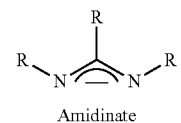

Amidinate wherein each R is independently selected from the group consisting of of H, alkyl, fluoroalkyl, alkylsilyl, alkylamino, and alkoxy substituents, and wherein the the guanidinidate ligand is:

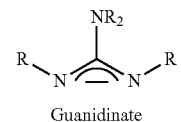

Guanidinate wherein each R is independently selected from the group consisting of of H, alkyl, fluoroalkyl, alkylsilyl, alkylamino, and alkoxy substituents.

15. A system for processing a semiconductor substrate, the system comprising:
(a) a processing chamber, having a substrate holder and one or more inlets for introduction of reactants to the processing chamber; and
(b) a system controller comprising program instructions for:
(i) causing an introduction of a molybdenum-containing precursor to the processing chamber, wherein the molybdenum-containing precursor is $Mo_2L_n$, wherein each L is independently selected from the group consisting of an amidate, an amidinate and a guanidinate ligands, wherein n is 2-5, and wherein the molybdenum-containing precursor comprises a multiple molybdenum-molybdenum bond; and
(ii) causing the molybdenum-containing precursor to react and form a molybdenum containing layer on the semiconductor substrate.

16. A system for processing a semiconductor substrate, the system comprising:
- (a) a processing chamber, having a substrate holder and one or more inlets for introduction of reactants to the processing chamber; and
- (b) a system controller comprising program instructions for:
  - (i) causing an introduction of a molybdenum-containing precursor to the processing chamber, wherein the molybdenum-containing precursor is a compound that includes:

molybdenum;

at least one sulfur-containing ligand that forms molybdenum-sulfur bond with molybdenum, wherein the compound does not include molybdenum-carbon bonds, and wherein the at least one sulfur-containing ligand is a dithiolene, alpha iminothiolene, alpha dithiolate or beta dithiolate; and
  - (ii) causing the molybdenum-containing precursor to react and form a molybdenum metal layer on the semiconductor substrate.

* * * * *